US011631695B2

(12) United States Patent
Sharangpani et al.

(10) Patent No.: US 11,631,695 B2
(45) Date of Patent: Apr. 18, 2023

(54) THREE-DIMENSIONAL MEMORY DEVICE CONTAINING COMPOSITE WORD LINES CONTAINING METAL AND SILICIDE AND METHOD OF MAKING THEREOF

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 259 days.

(21) Appl. No.: 17/085,735

(22) Filed: Oct. 30, 2020

(65) Prior Publication Data
US 2022/0139949 A1 May 5, 2022

(51) Int. Cl.
*H01L 23/522* (2006.01)
*H01L 27/11582* (2017.01)
*H01L 27/11556* (2017.01)
*G11C 8/14* (2006.01)
*H01L 27/1157* (2017.01)
*H01L 27/11519* (2017.01)
(Continued)

(52) U.S. Cl.
CPC .......... *H01L 27/11582* (2013.01); *G11C 8/14* (2013.01); *H01L 23/5226* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11519; H01L 27/11524; H01L 27/11556; H01L 27/11565; H01L 27/1157; H01L 27/11575; H01L 23/5226; H01L 21/76858; H01L 21/28556; H01L 21/76883; H01L 21/76889; H01L 21/76847; H01L 29/40117; G11C 8/14
See application file for complete search history.

(56) References Cited

U.S. PATENT DOCUMENTS 5,915,167 A 6/1999 Leedy
8,349,681 B2 1/2013 Alsmeier et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

*Primary Examiner* — Calvin Y Choi
(74) *Attorney, Agent, or Firm* — The Marbury Law Group PLLC

(57) ABSTRACT

A three-dimensional memory device includes an alternating stack of insulating layers and electrically conductive layers located over a substrate. Each electrically conductive layer within a subset of the electrically conductive layers includes a respective first metal layer containing an elemental metal and a respective first metal silicide layer containing a metal silicide of the elemental metal. Memory openings vertically extend through the alternating stack. Memory opening fill structures located within the memory openings can include a respective memory film and a respective vertical semiconductor channel.

4 Claims, 31 Drawing Sheets

(51) Int. Cl.
*H01L 27/11524* (2017.01)
*H01L 27/11565* (2017.01)

(56) References Cited

U.S. PATENT DOCUMENTS

| | | |
|---|---|---|
| 8,658,499 B2 | 2/2014 | Makala et al. |
| 8,847,302 B2 | 9/2014 | Alsmeier et al. |
| 8,928,061 B2 | 1/2015 | Chien et al. |
| 9,159,739 B2 | 10/2015 | Makala et al. |
| 9,252,151 B2 | 2/2016 | Chien et al. |
| 9,356,031 B2 | 5/2016 | Lee et al. |
| 9,397,093 B2 | 7/2016 | Makala et al. |
| 9,419,012 B1 | 8/2016 | Shimabukuro et al. |
| 9,449,982 B2 | 9/2016 | Lu et al. |
| 9,576,975 B2 | 2/2017 | Zhang et al. |
| 9,627,399 B2 | 4/2017 | Kanakamedala et al. |
| 9,646,975 B2 | 5/2017 | Peri et al. |
| 9,691,884 B2 | 6/2017 | Makala et al. |
| 9,780,182 B2 | 10/2017 | Peri et al. |
| 9,793,139 B2 | 10/2017 | Sharangpani et al. |
| 9,842,907 B2 | 12/2017 | Makala et al. |
| 9,875,929 B1 | 1/2018 | Shukla et al. |
| 9,984,963 B2 | 5/2018 | Peri et al. |
| 10,115,732 B2 | 10/2018 | Yu et al. |
| 10,128,261 B2 | 11/2018 | Makala et al. |
| 10,256,247 B1 | 4/2019 | Kanakamedala et al. |
| 10,276,583 B2 | 4/2019 | Sharangpani et al. |
| 10,290,652 B1 | 5/2019 | Sharangpani et al. |
| 10,529,620 B2 | 1/2020 | Sharangpani et al. |
| 10,651,196 B1 | 5/2020 | Sharangpani et al. |
| 10,741,572 B2 | 8/2020 | Sharangpani et al. |
| 2013/0264631 A1 | 10/2013 | Alsmeier et al. |
| 2014/0225181 A1 | 8/2014 | Makala et al. |
| 2015/0061155 A1* | 3/2015 | Seo .............. H01L 29/1037 257/774 |
| 2015/0294978 A1 | 10/2015 | Lu et al. |
| 2016/0043093 A1 | 2/2016 | Lee et al. |
| 2016/0225866 A1 | 8/2016 | Peri et al. |
| 2016/0351497 A1 | 12/2016 | Peri et al. |
| 2017/0025431 A1 | 1/2017 | Kanakamedala et al. |
| 2017/0084618 A1 | 3/2017 | Peri et al. |
| 2017/0125538 A1 | 5/2017 | Sharangpani et al. |
| 2017/0243879 A1 | 8/2017 | Yu et al. |
| 2017/0352669 A1 | 12/2017 | Sharangpani et al. |
| 2018/0033646 A1* | 2/2018 | Sharangpani ..... H01L 27/11582 |
| 2018/0090373 A1* | 3/2018 | Sharangpani ..... H01L 21/76843 |
| 2019/0287916 A1 | 9/2019 | Sharangpani et al. |
| 2019/0287982 A1 | 9/2019 | Hinoue et al. |

\* cited by examiner

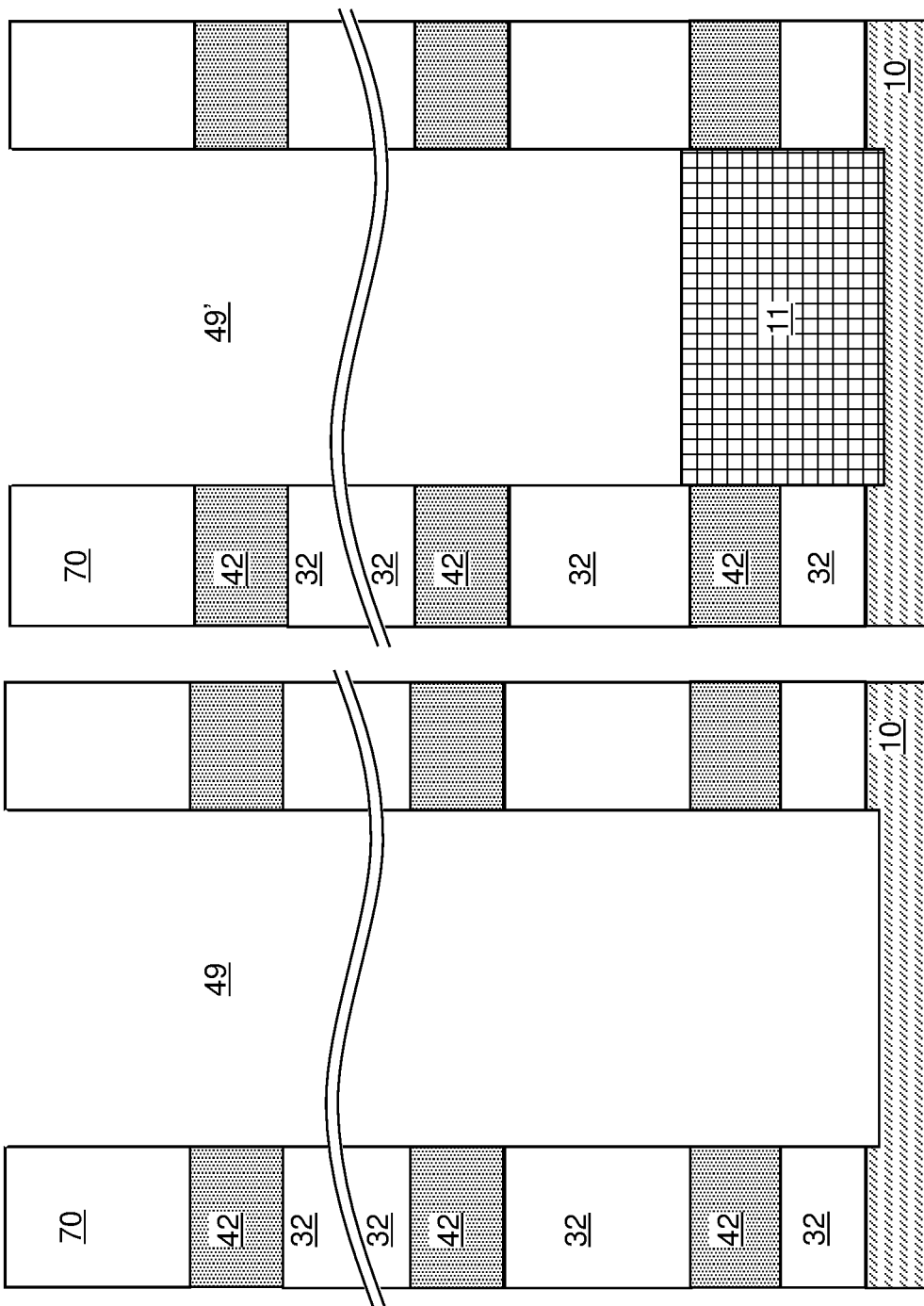

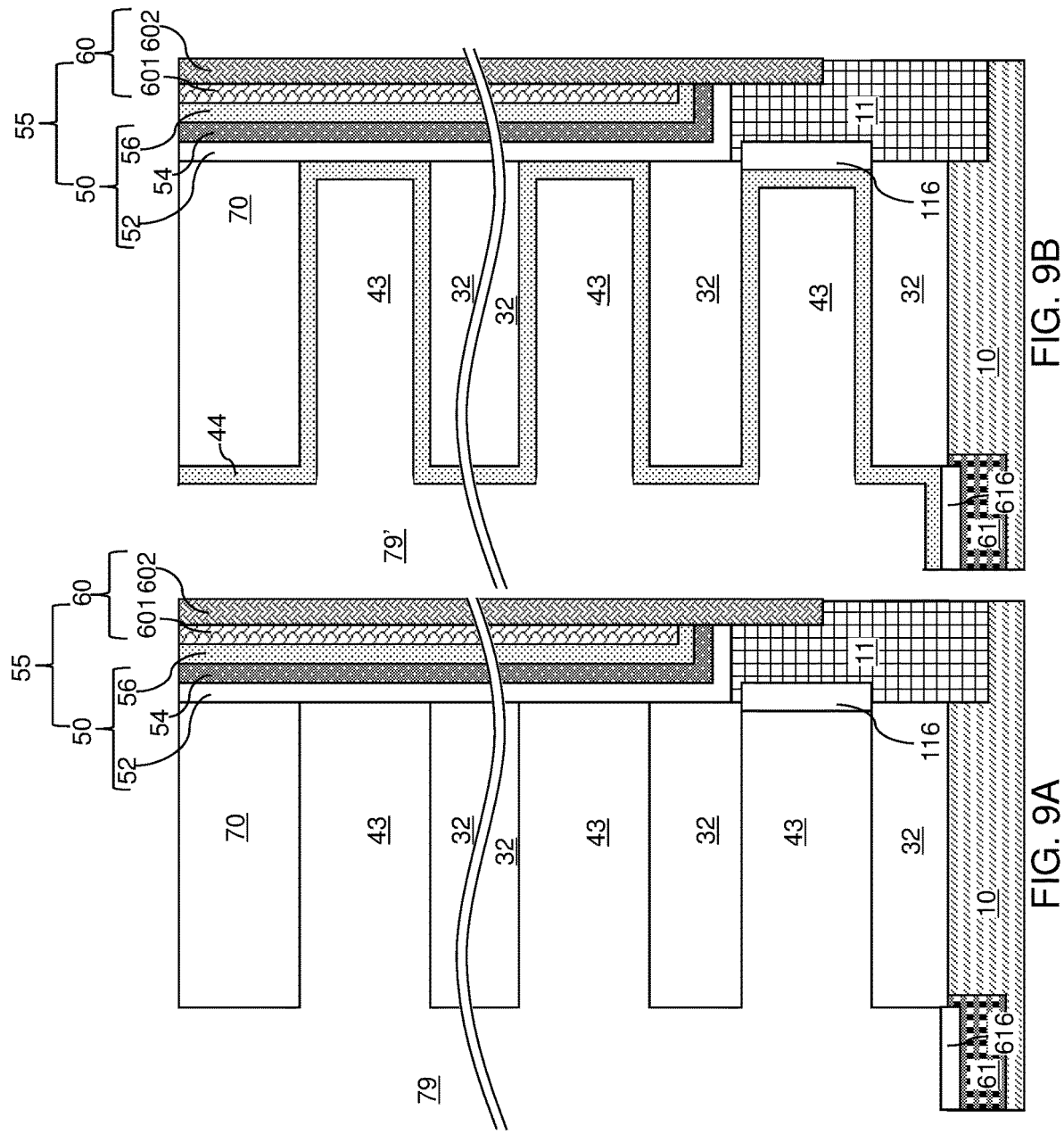

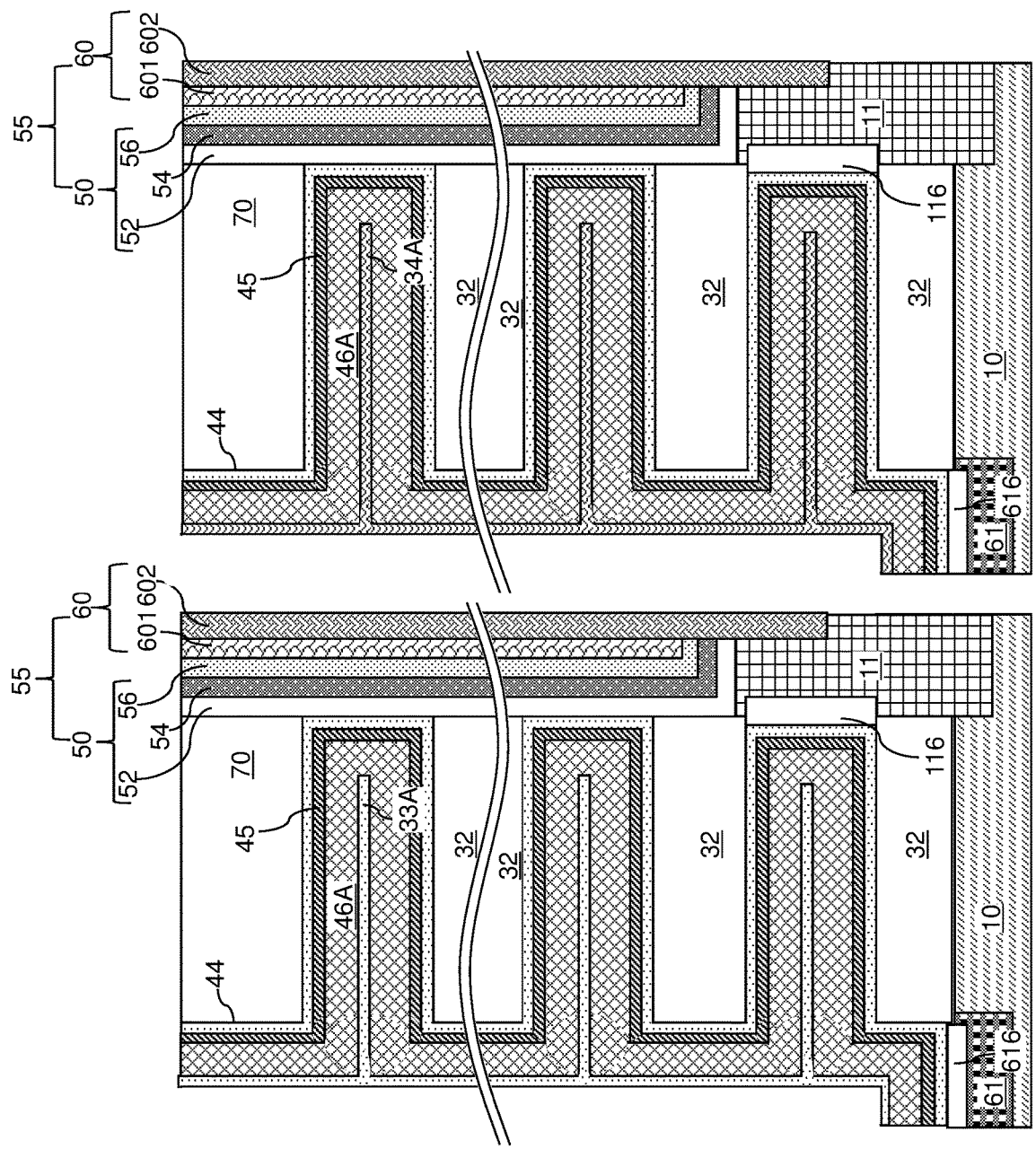

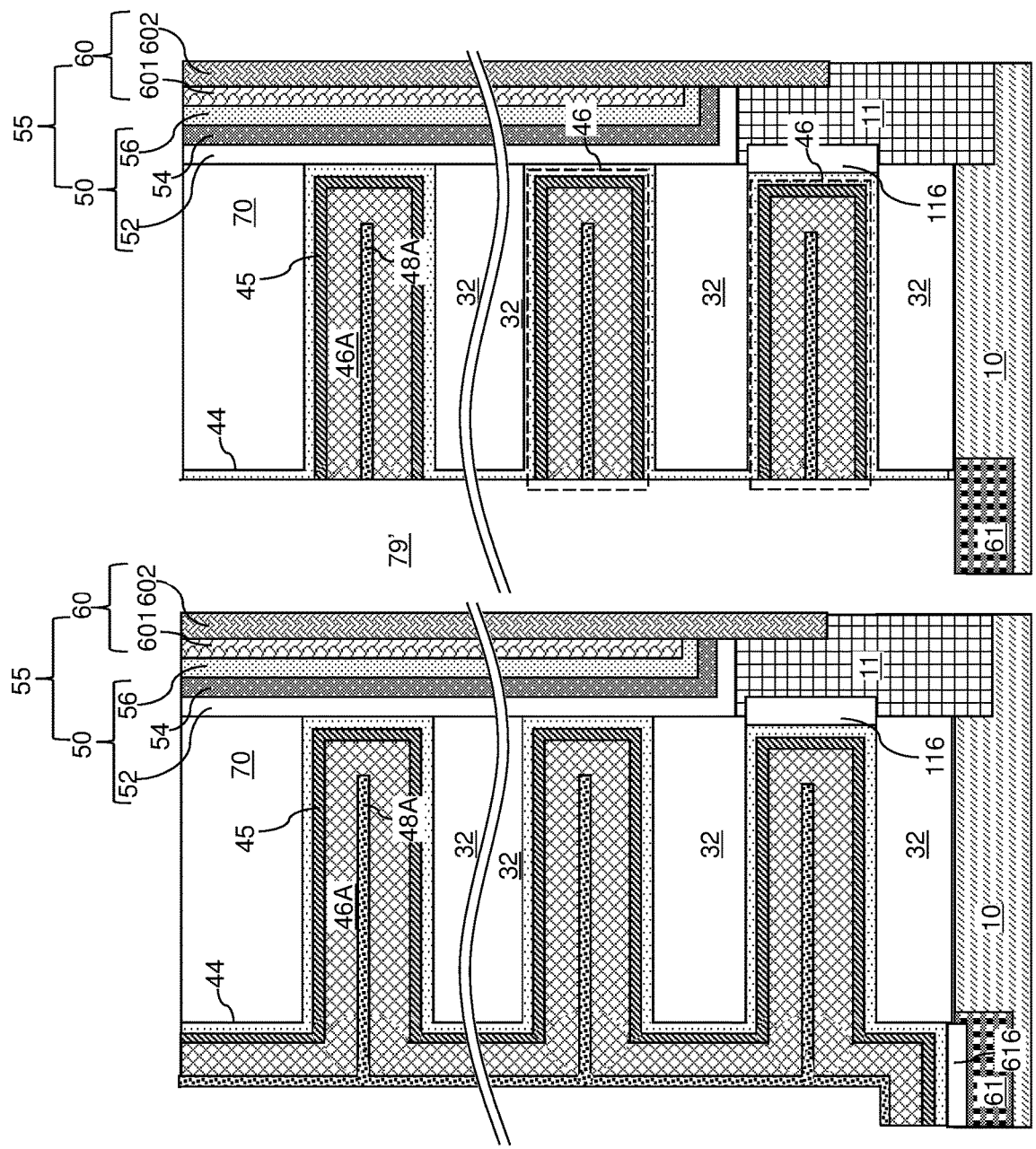

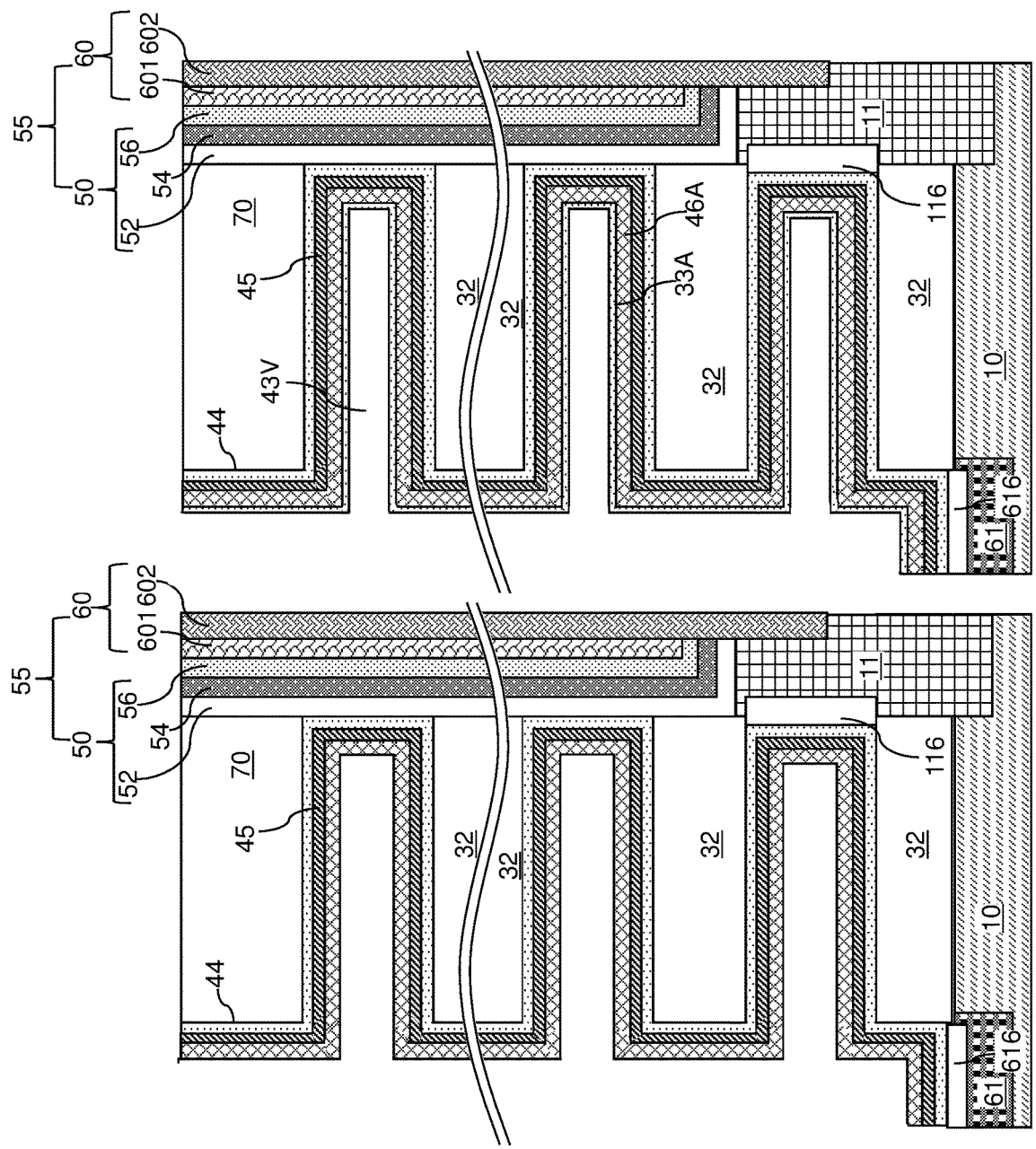

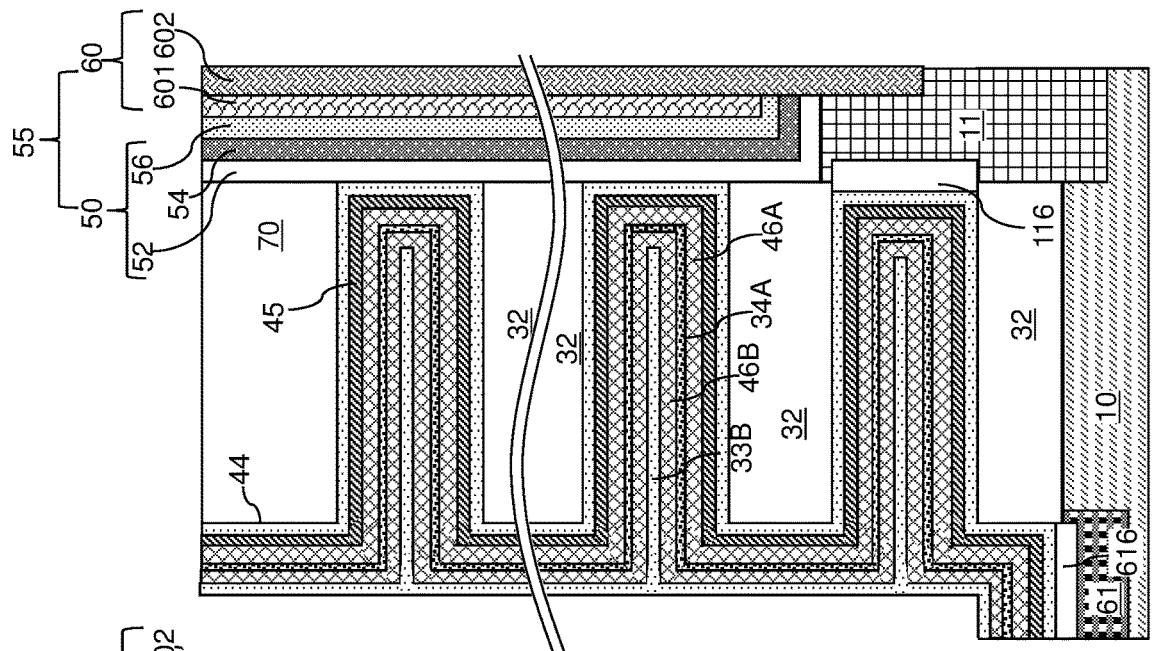
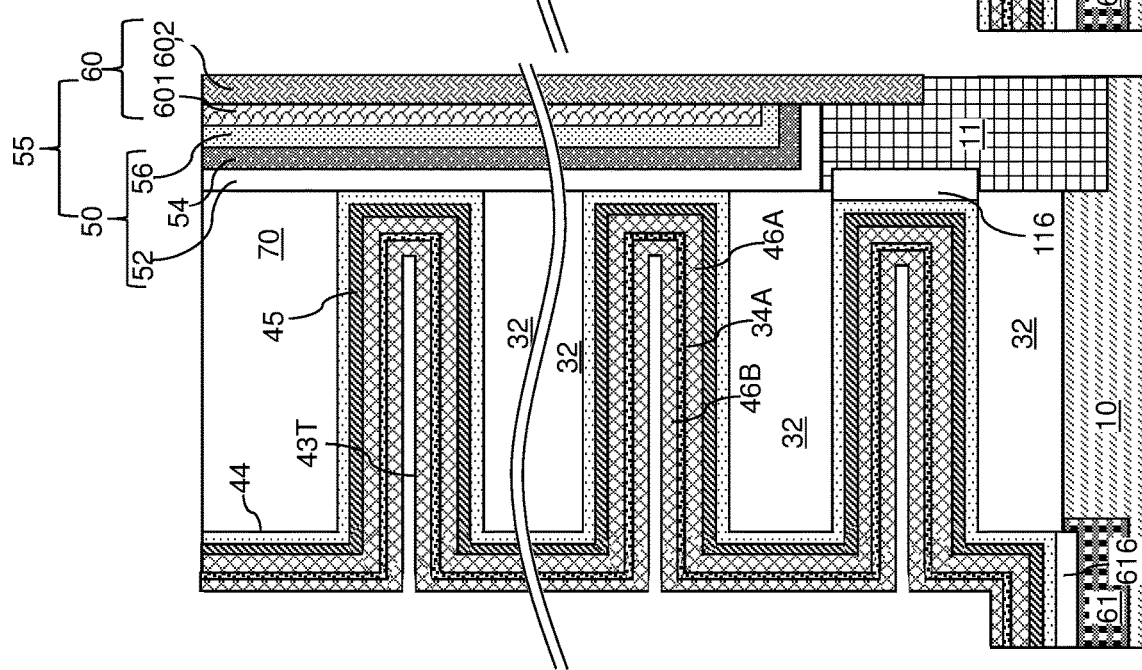

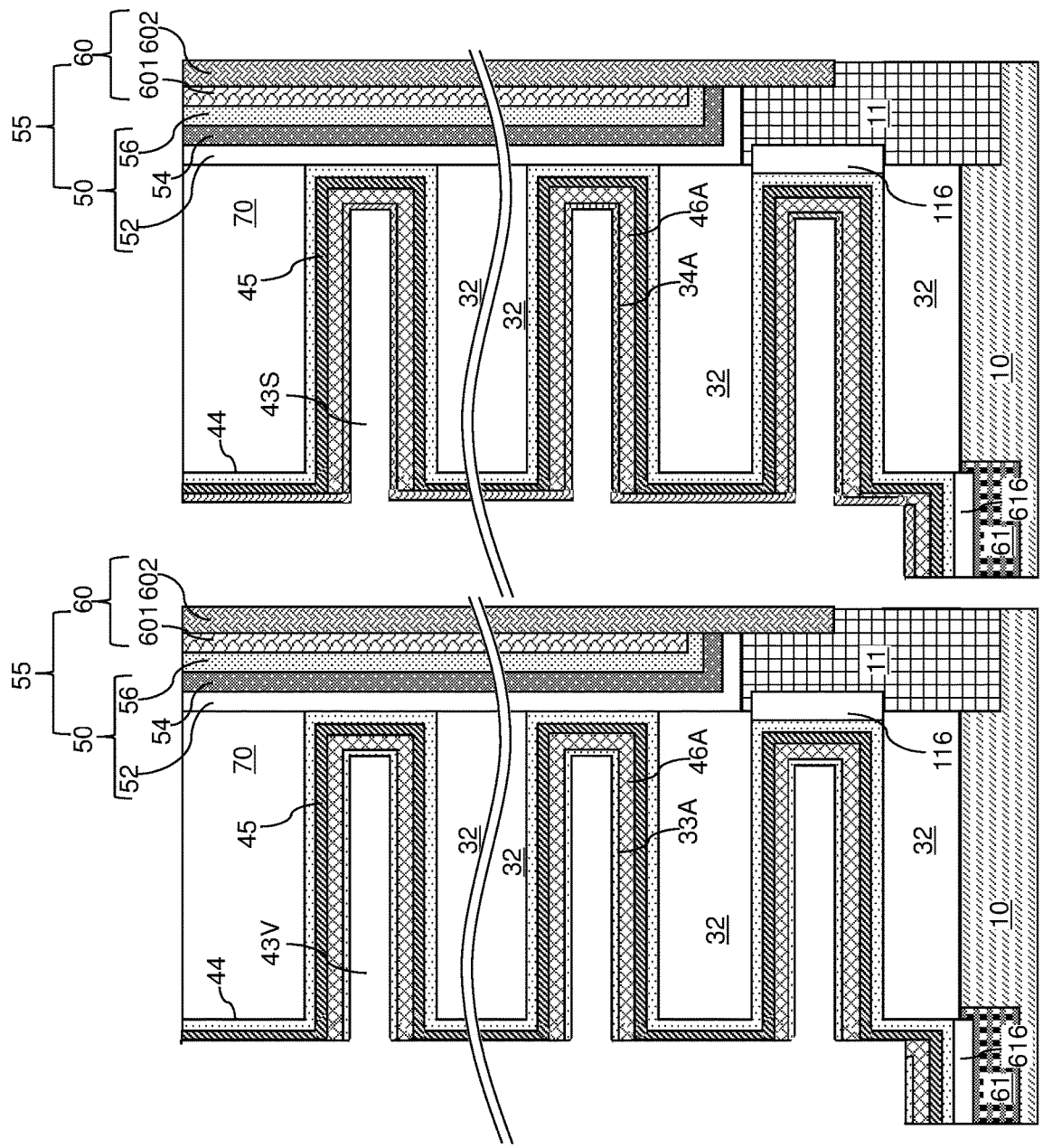

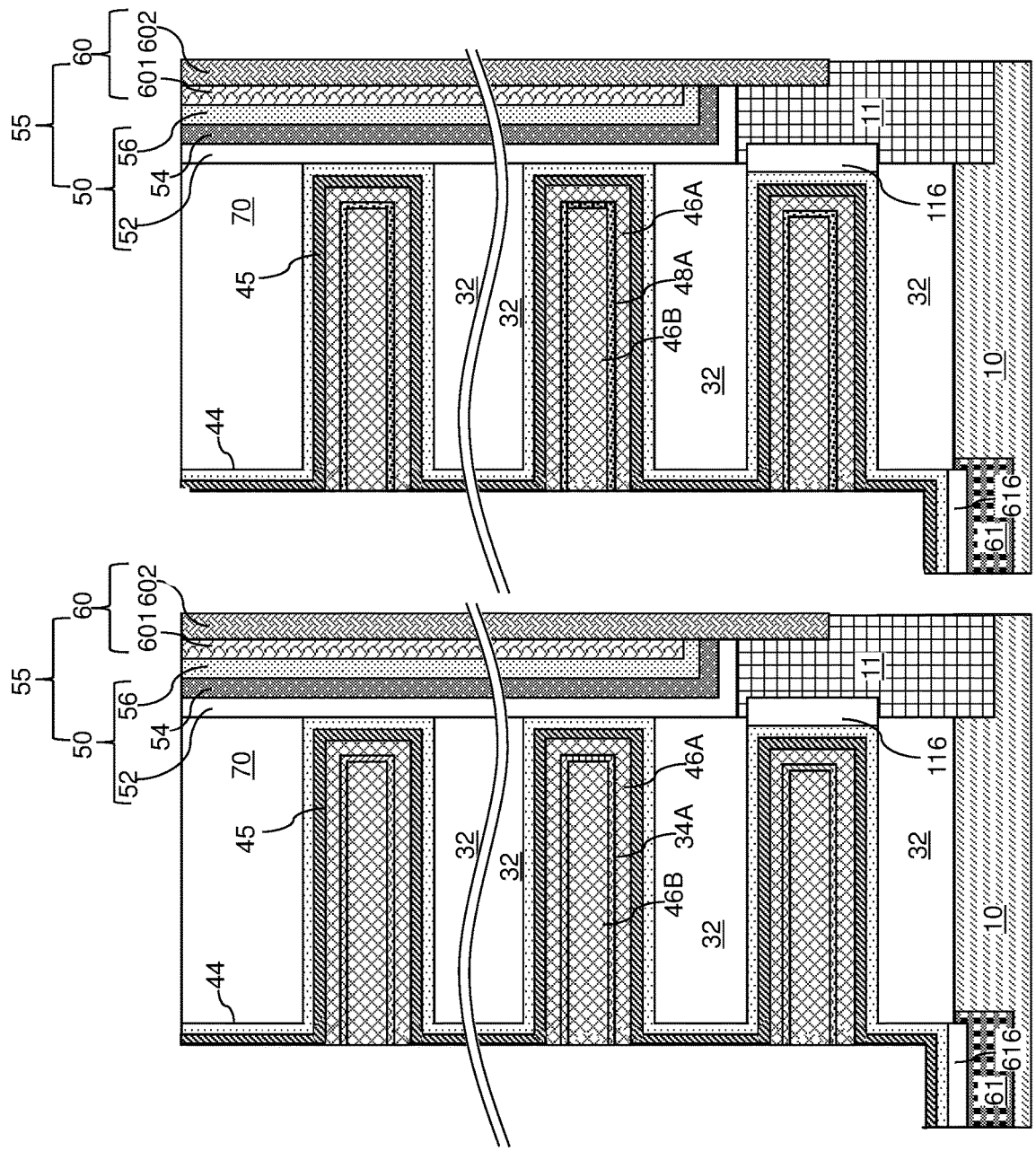

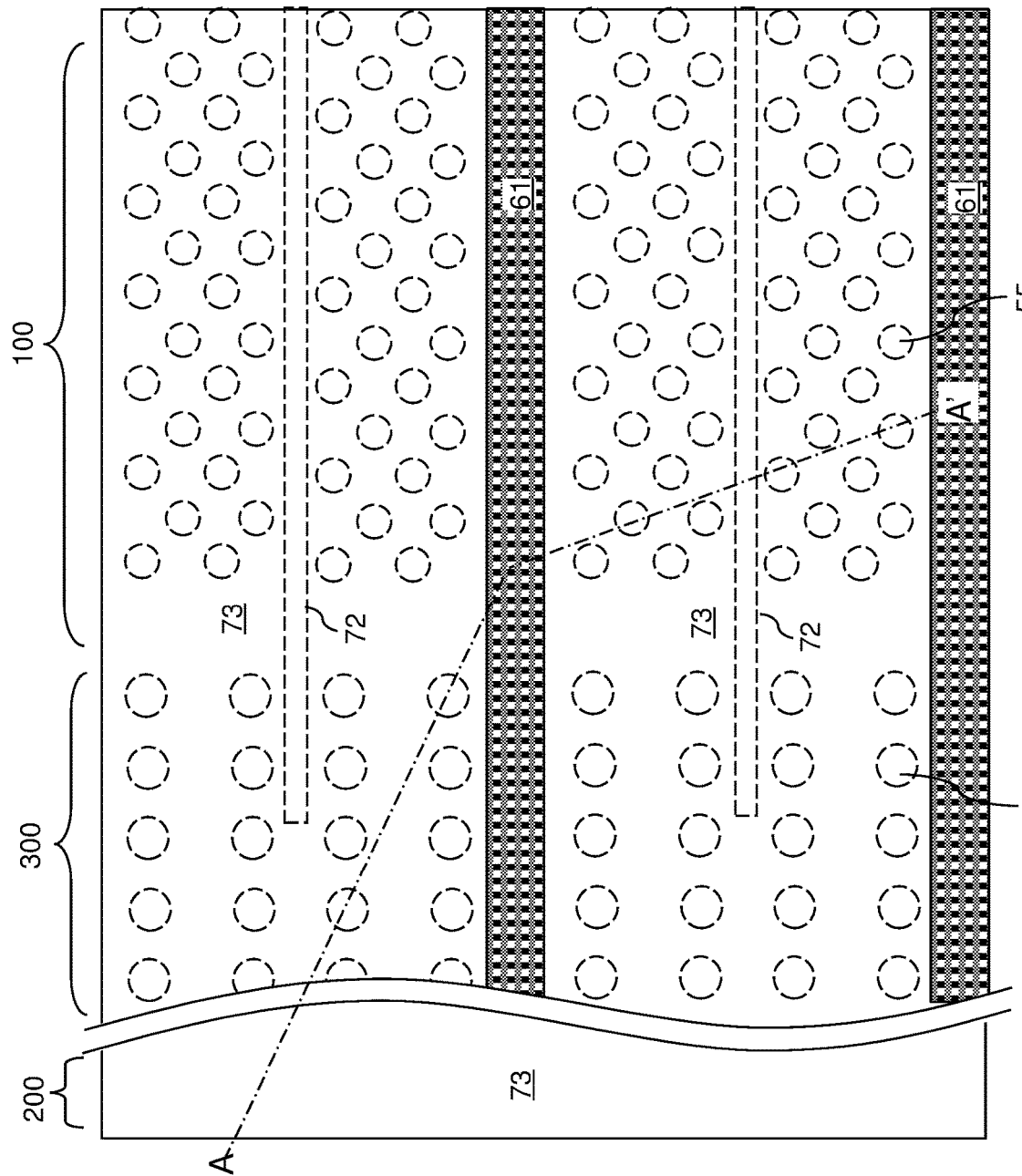

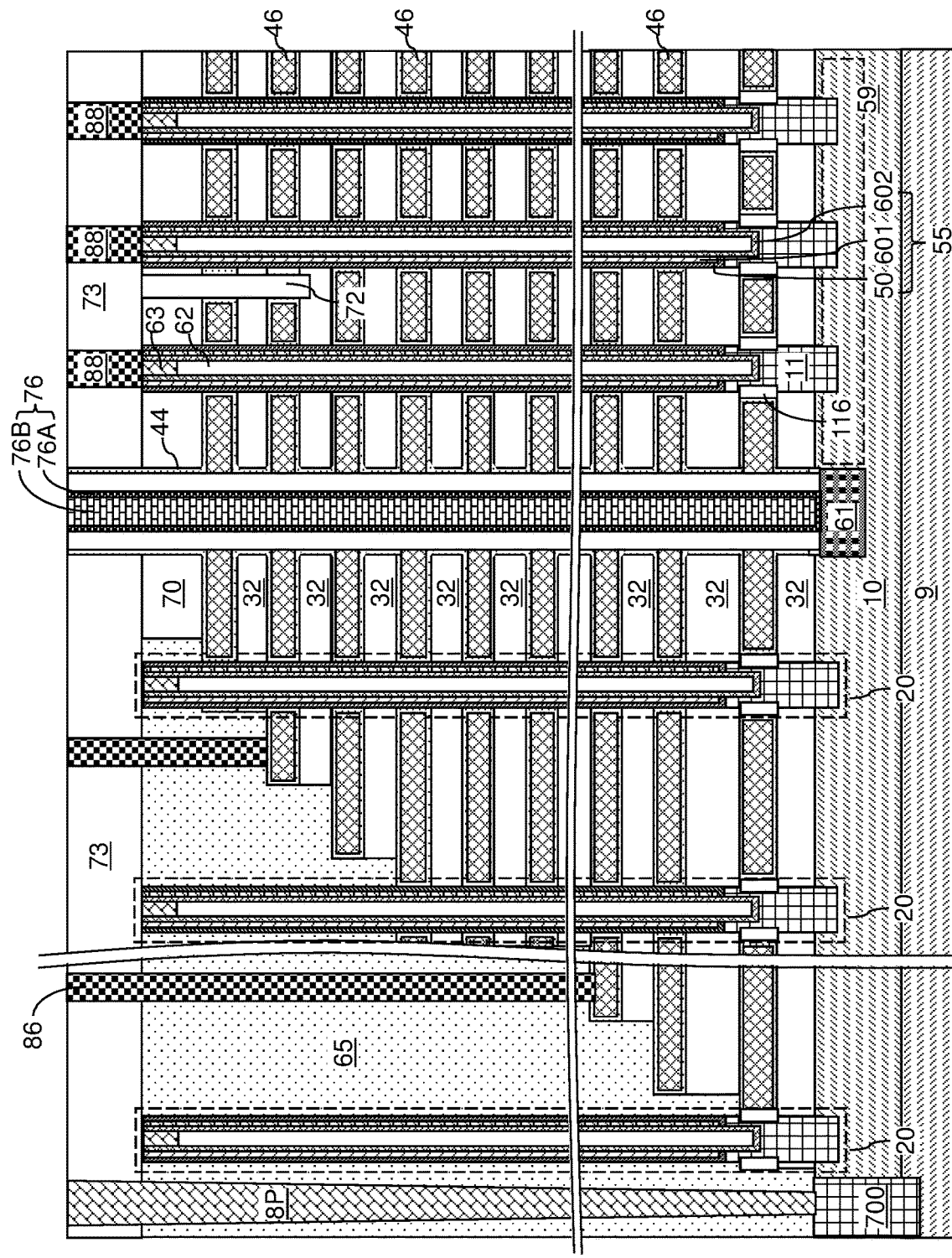

THREE-DIMENSIONAL MEMORY DEVICE CONTAINING COMPOSITE WORD LINES CONTAINING METAL AND SILICIDE AND METHOD OF MAKING THEREOF

FIELD

The present disclosure relates generally to the field of semiconductor devices, and particular to a three-dimensional memory device employing composite word lines containing metal and silicide and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein each electrically conductive layer within a subset of the electrically conductive layers comprises a respective first metal layer containing an elemental metal and a respective first metal silicide layer comprising a metal silicide of the elemental metal; memory openings vertically extending through the alternating stack; and memory opening fill structures located within the memory openings and comprising a respective memory film and a respective vertical semiconductor channel. Each first metal silicide layer is spaced from a respective overlying one of the insulating layers, from a respective one of the underlying one of the insulating layers, and from a respective one of the memory openings by the respective first metal layer.

According to another aspect of the present disclosure, a method of forming a three-dimensional memory device is provided, which comprises: forming an alternating stack of insulating layers and sacrificial material layers over a substrate; forming memory openings vertically extending through the alternating stack; forming memory opening fill structures in the memory openings, wherein each of the memory opening fill structures comprises a respective memory film and a respective vertical semiconductor channel; forming backside recesses by removing the sacrificial material layers selective to the insulating layers and the memory opening fill structures; depositing a first metal layer containing an elemental metal in the backside recesses; and forming a first metal silicide layer comprising a metal silicide of the elemental metal on the first metal layer.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9H are sequential vertical cross-sectional views of a region of a first configuration of the exemplary structure during formation of electrically conductive layers according to an embodiment of the present disclosure.

FIGS. 10A-10H are sequential vertical cross-sectional views of a region of a second configuration of the exemplary structure during formation of electrically conductive layers according to an embodiment of the present disclosure.

FIGS. 11A-11G are sequential vertical cross-sectional views of a region of a third configuration of the exemplary structure during formation of electrically conductive layers according to an embodiment of the present disclosure.

FIG. 12B is a top-down view of the exemplary structure of FIG. 12A. The vertical plane A-A' is the plane of the schematic vertical cross-sectional view of FIG. 12A.

FIG. 14A is a schematic vertical cross-sectional view of the exemplary structure after formation of additional contact via structures according to an embodiment of the present disclosure.

DETAILED DESCRIPTION

Figure 1:
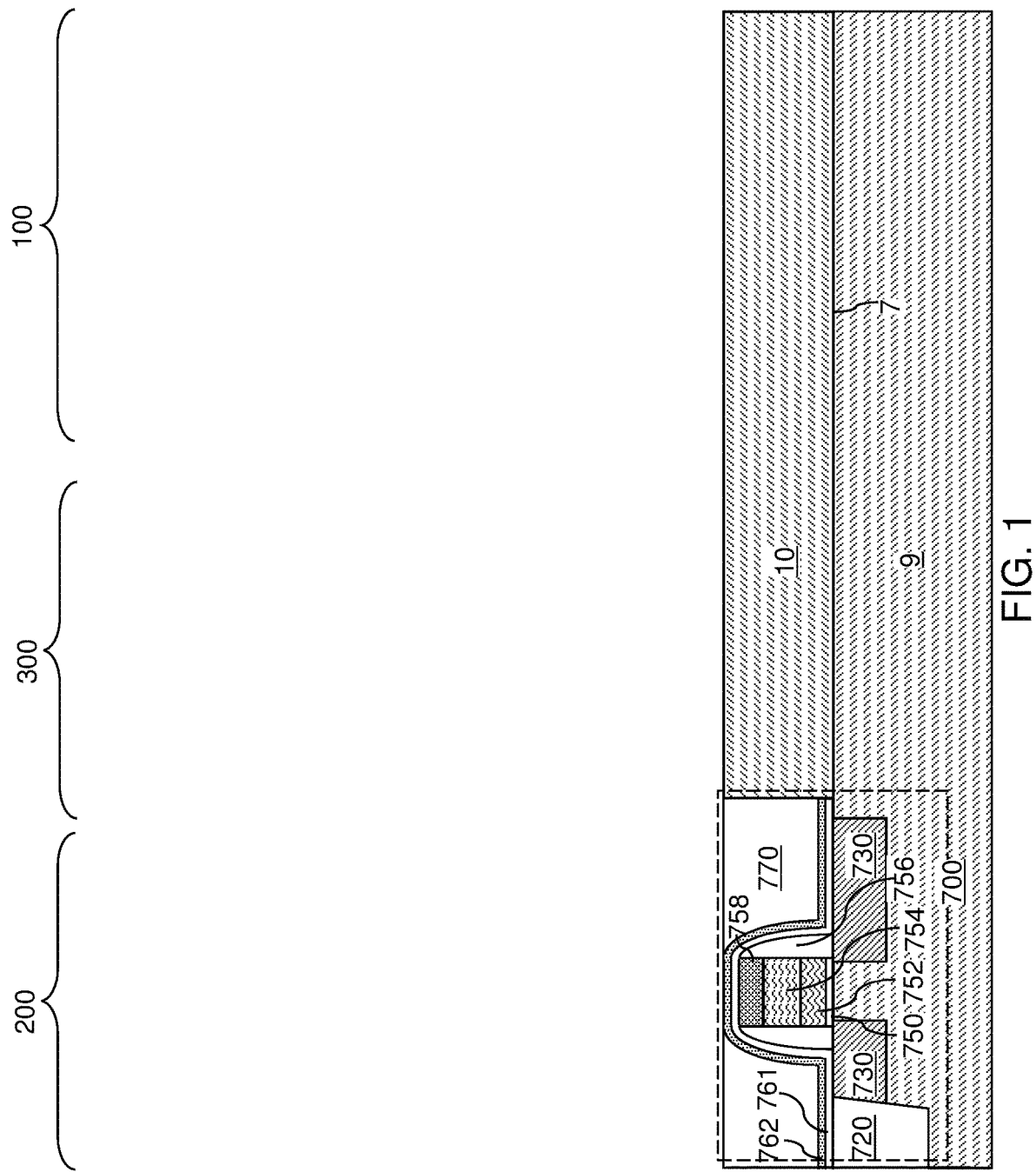
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below.

The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes. Identical, concurrent operations can take place on each plane, although with some restrictions. Each plane contains a number of blocks, which are the smallest unit that can be erased by in a single erase operation. Each block contains a number of pages, which are the smallest unit that can be programmed and/or on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
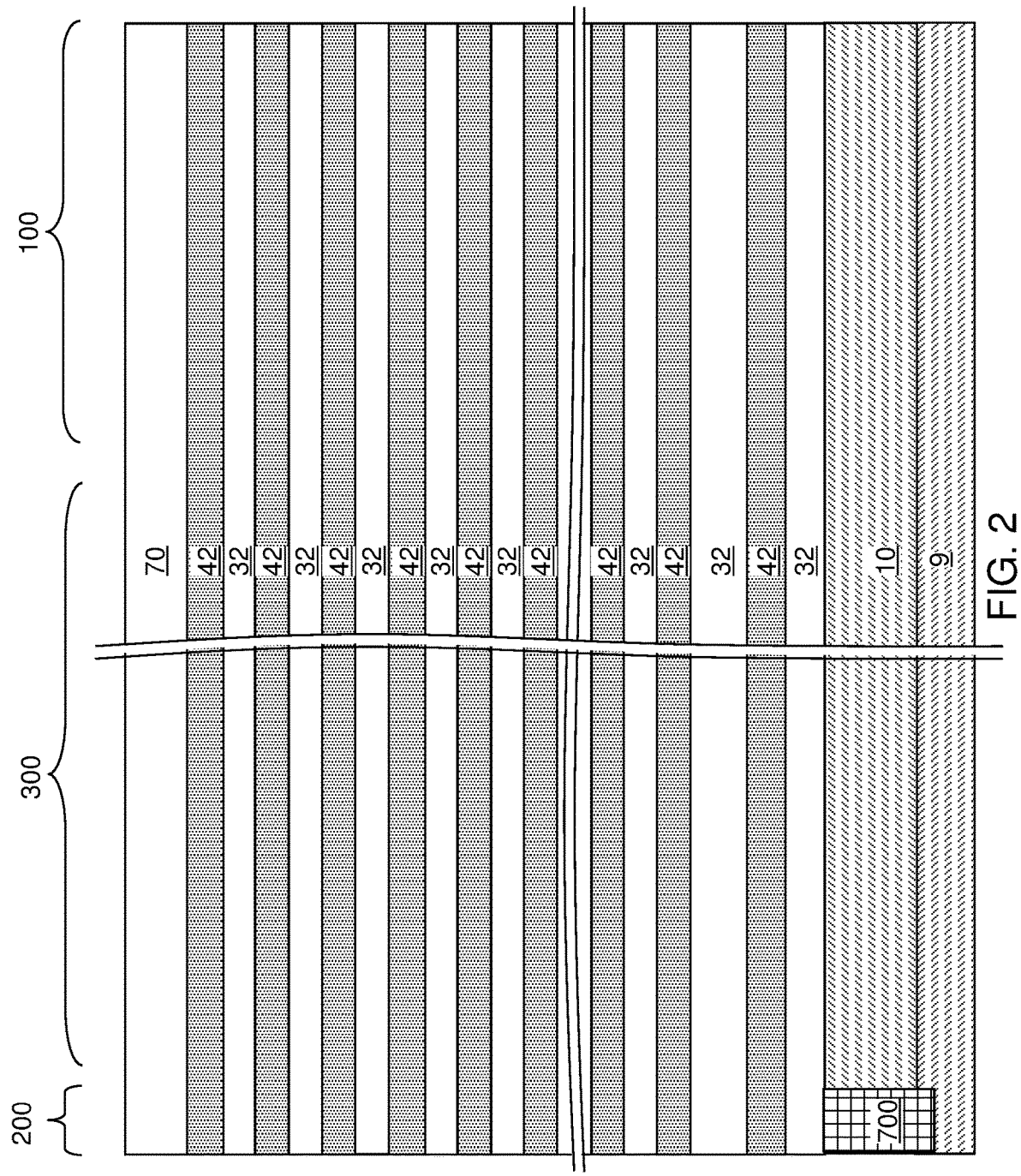
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
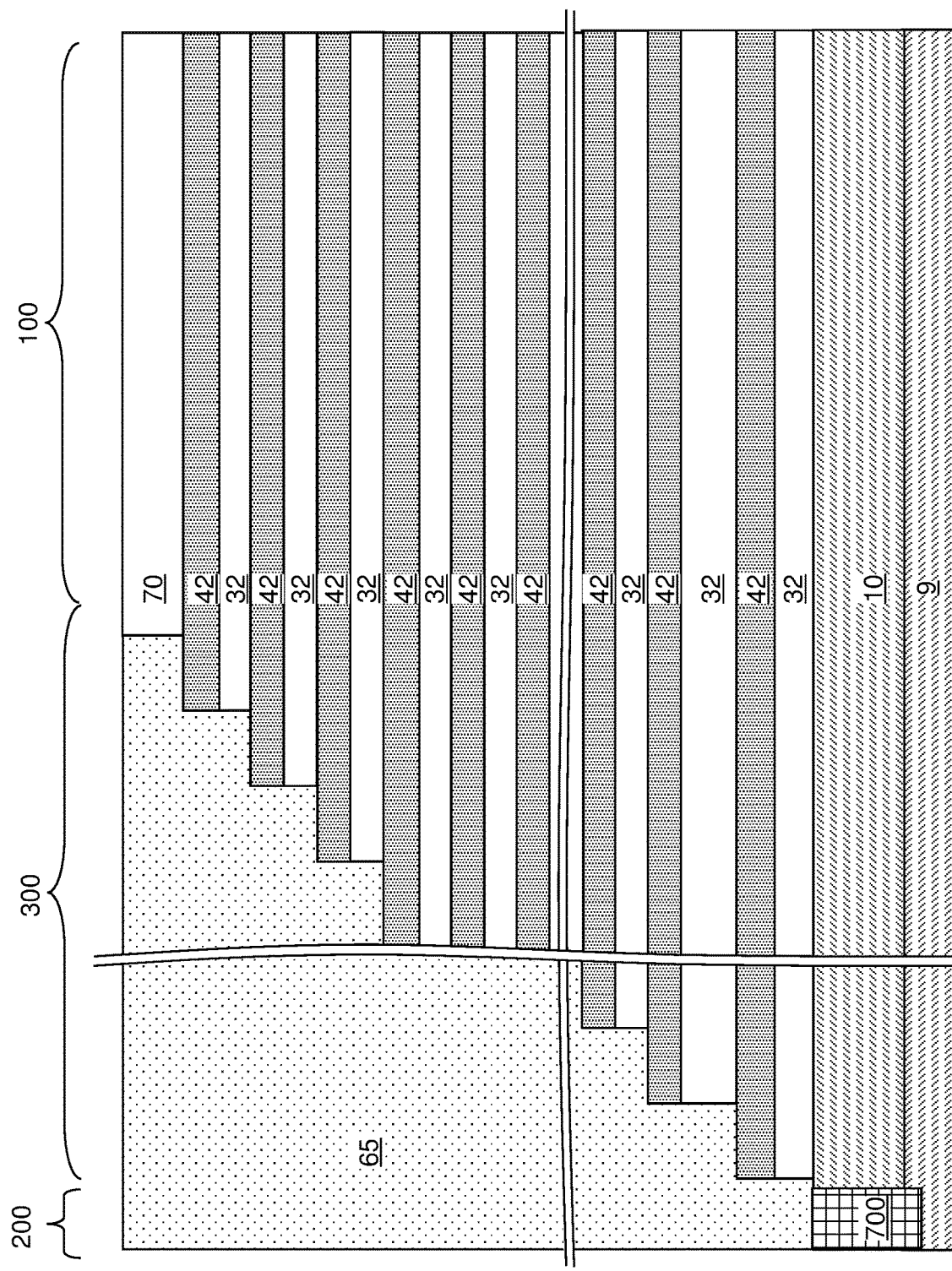
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
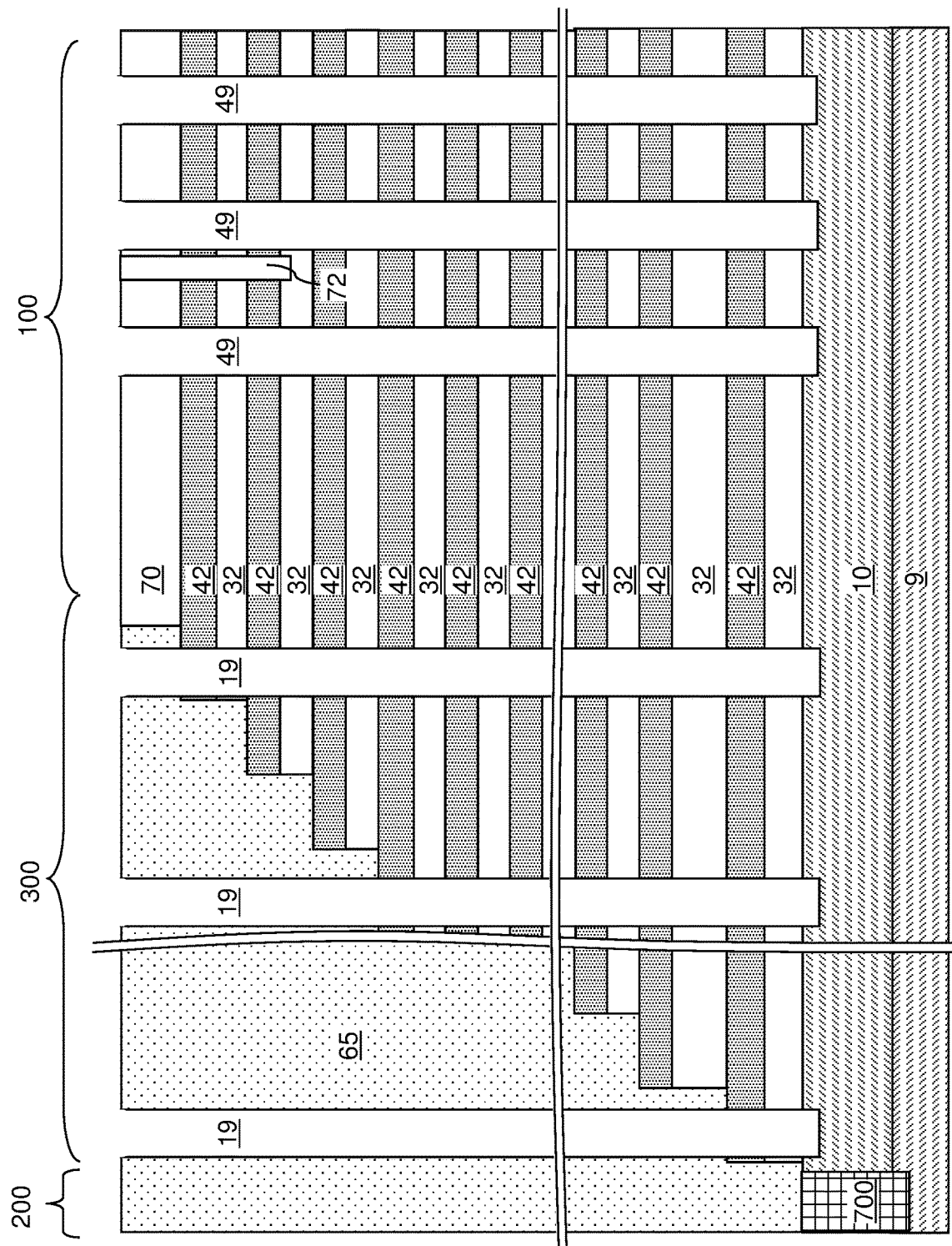
FIG. 4A is a schematic vertical cross-sectional view of the exemplary structure after formation of memory openings and support openings according to an embodiment of the present disclosure.
Figure 4B:
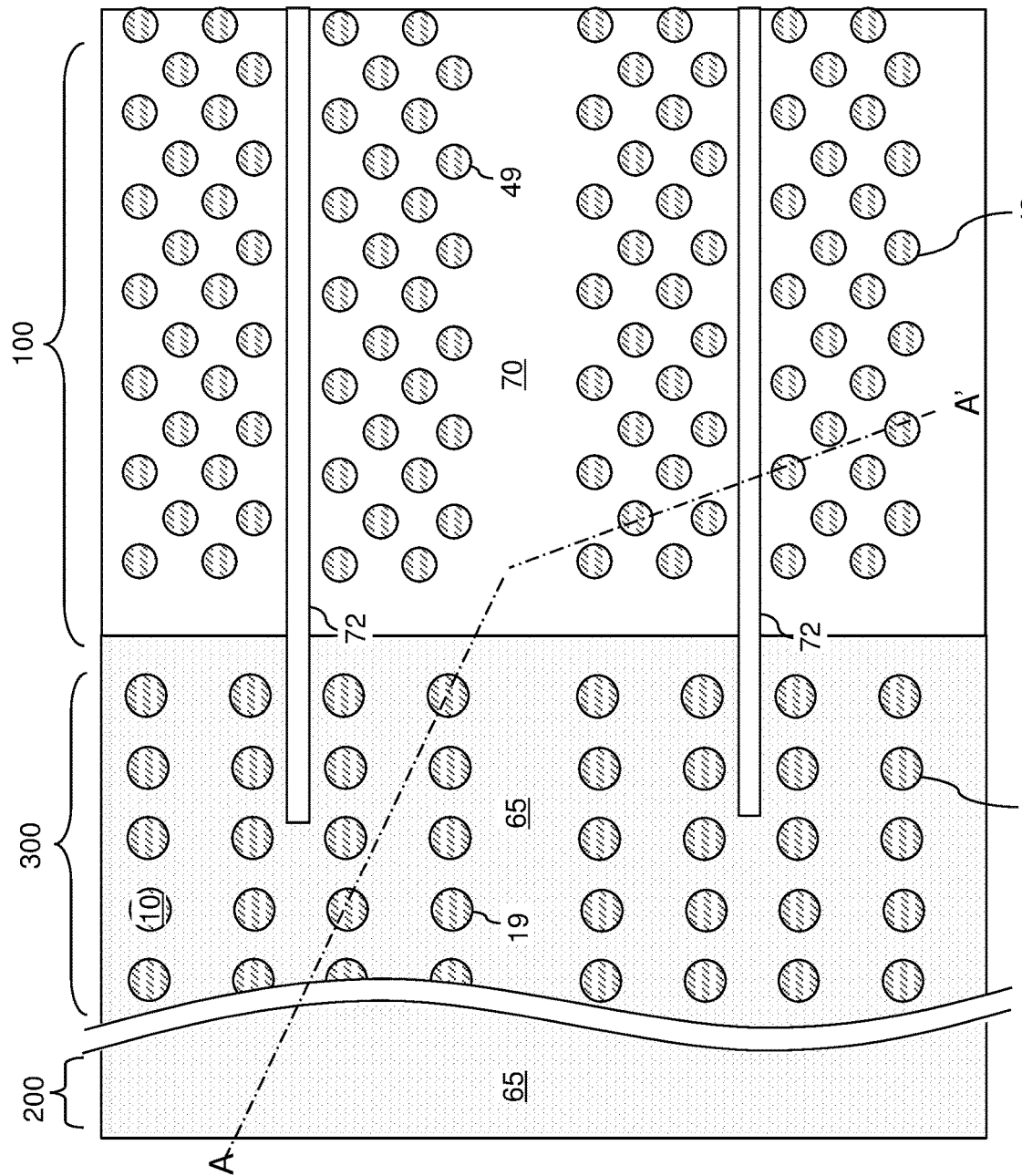
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5D:
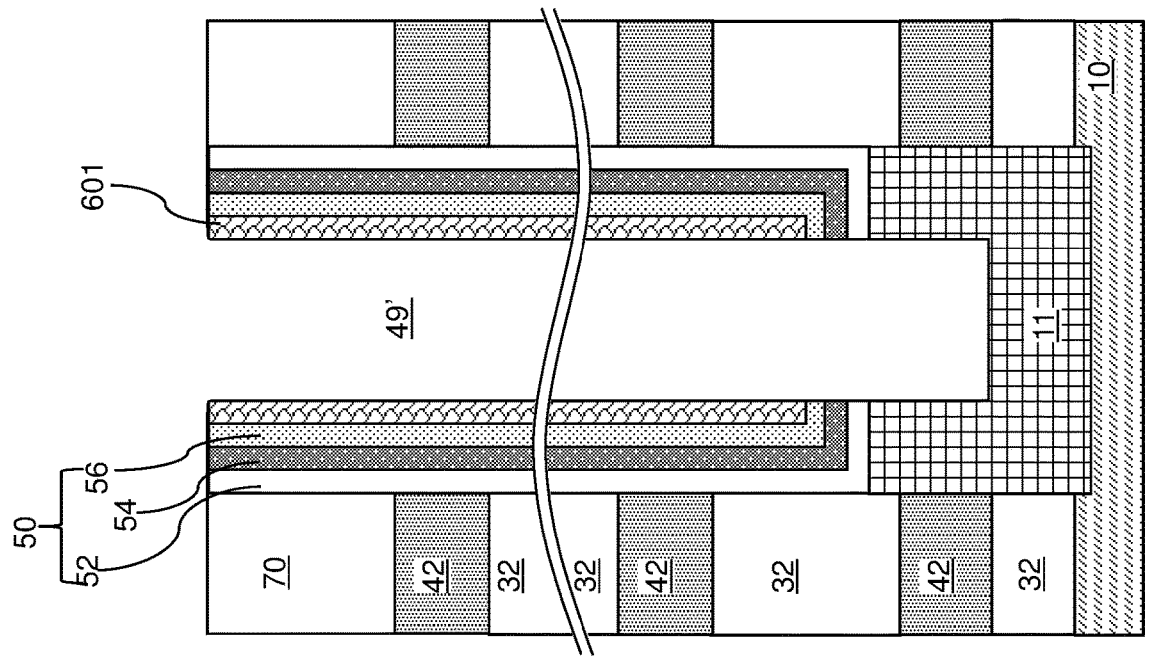
Figure 5C:
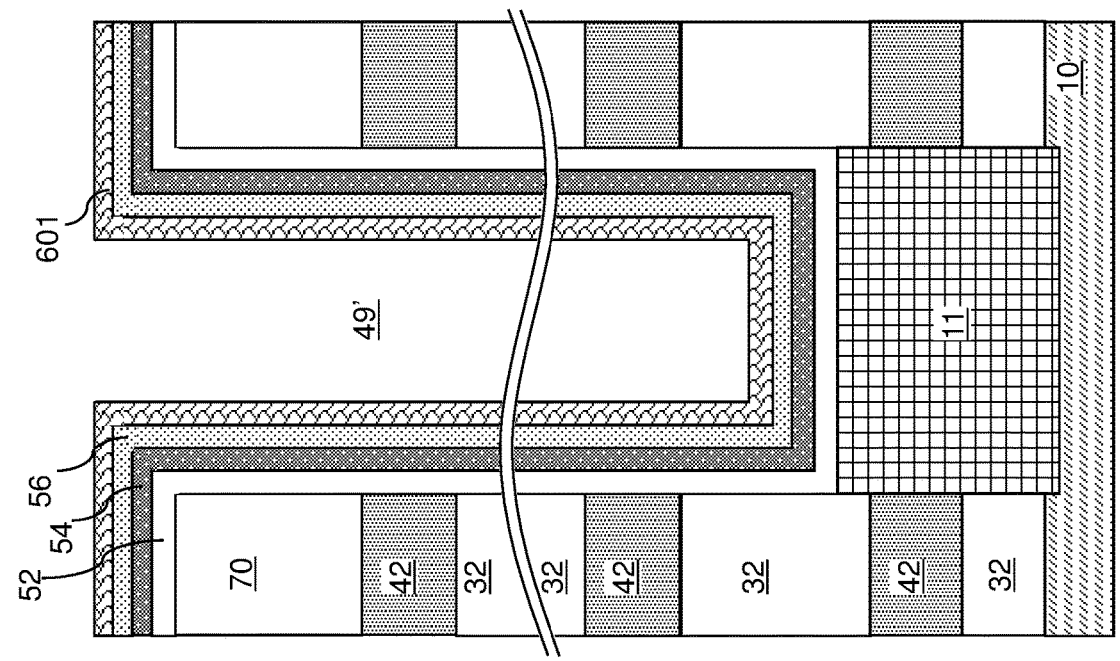

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
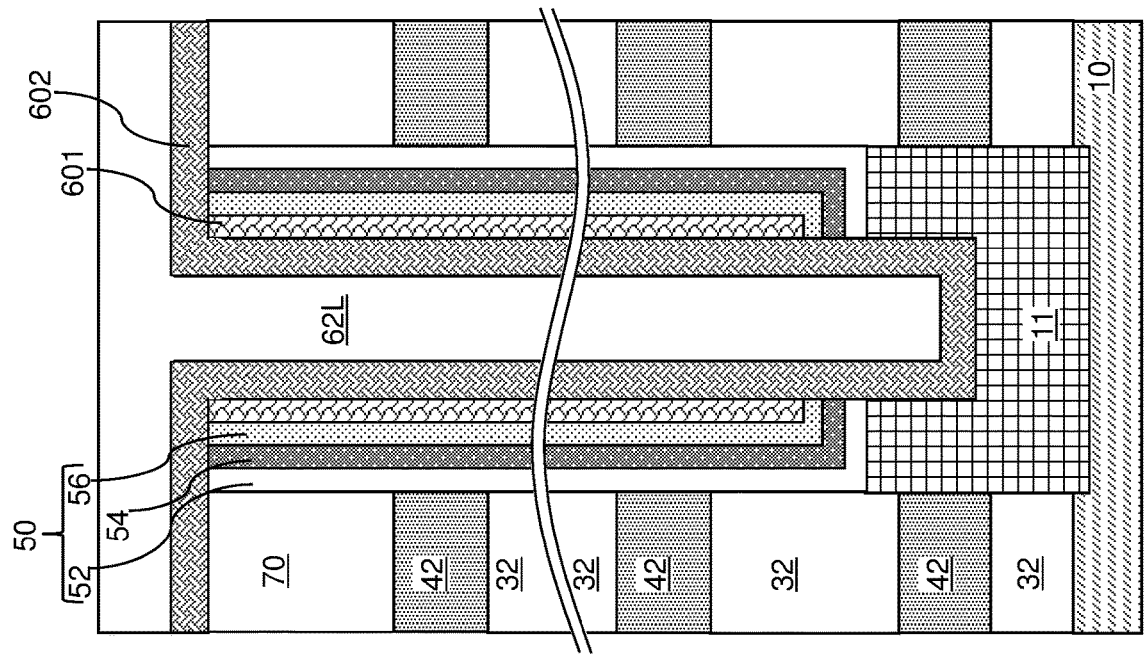

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
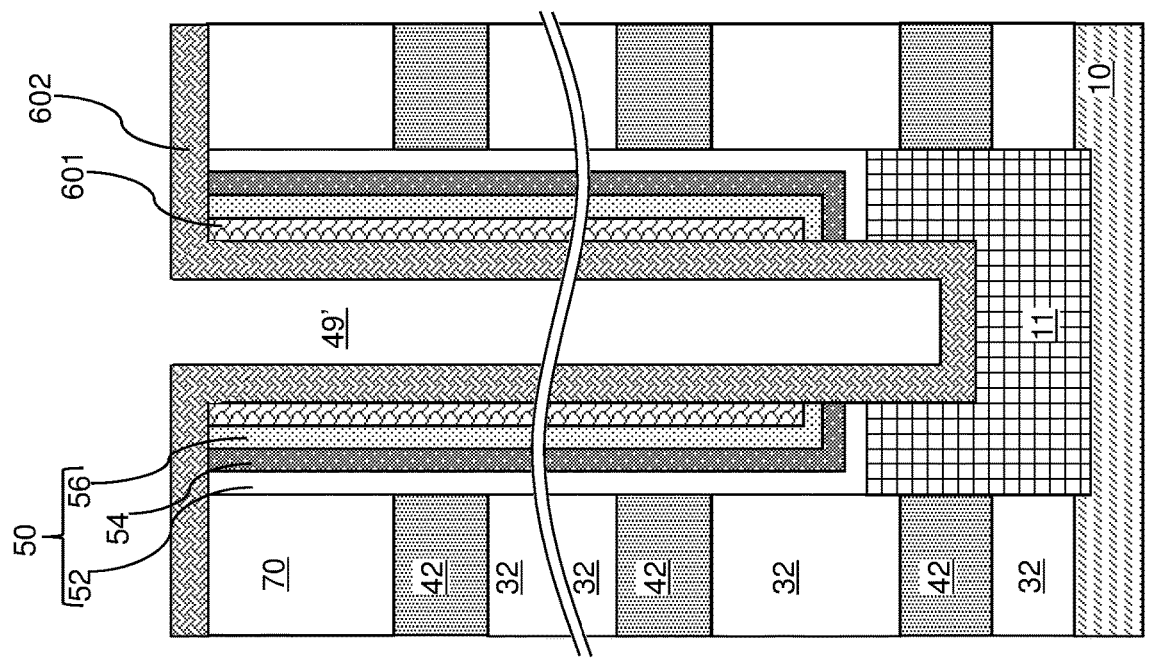

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
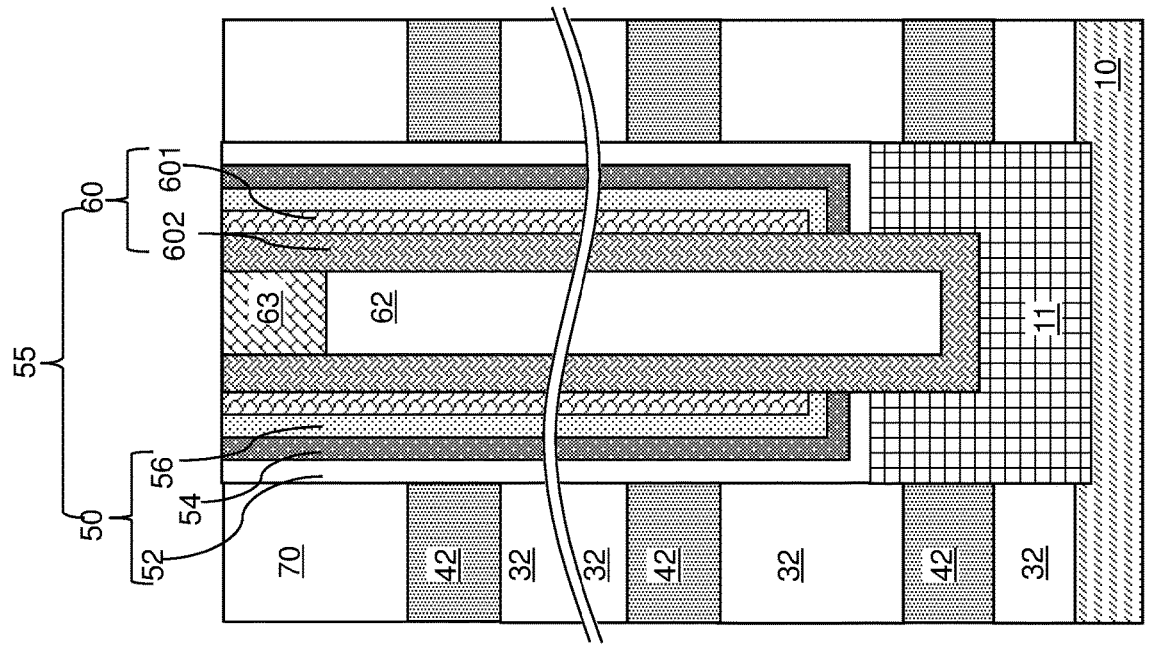
Figure 5G:
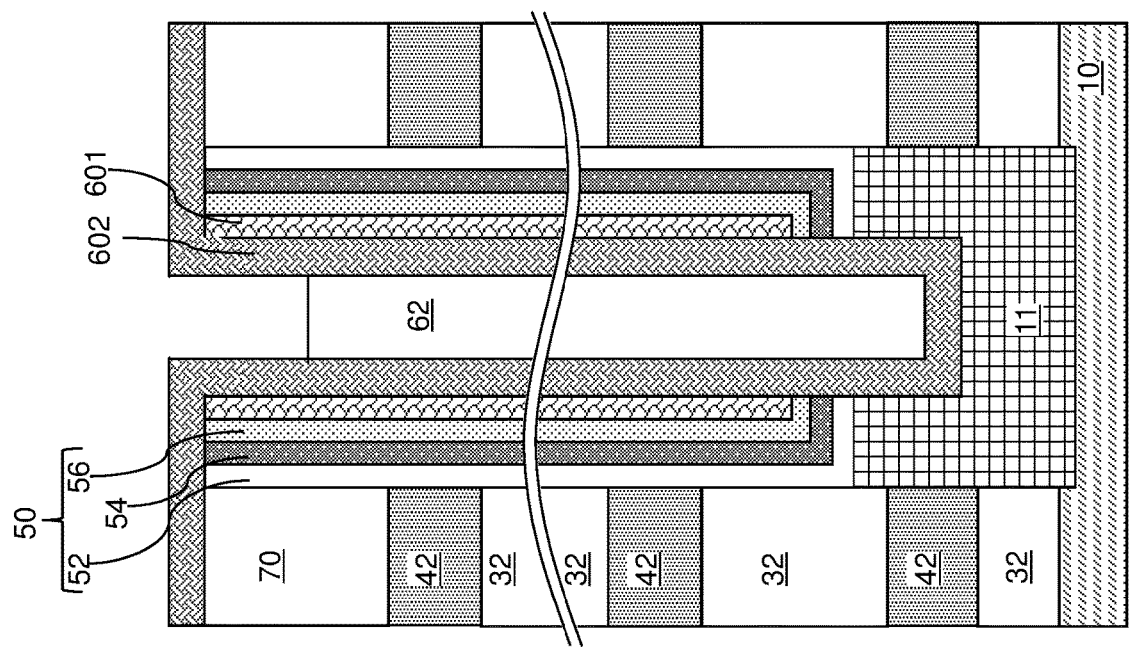

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. The top surface of each dielectric core 62 can be located below the horizontal plane including the top surface of the insulating cap layer 70.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the second conductivity type dopants in the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

A planarization process can be performed to remove excess portions of the deposited semiconductor material of the second conductivity type and the second semiconductor channel layer 602 from above the horizontal plane including the top surface of the insulating layer 70. The planarization process may employ a chemical mechanical planarization (CMP) process and/or a recess etch process. Each remaining portion of the doped semiconductor material of the second conductivity type constitutes a drain region 63. A horizontal portion of the second semiconductor channel layer 602 located above the top surface of the insulating cap layer 70 can be removed by the planarization process. Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
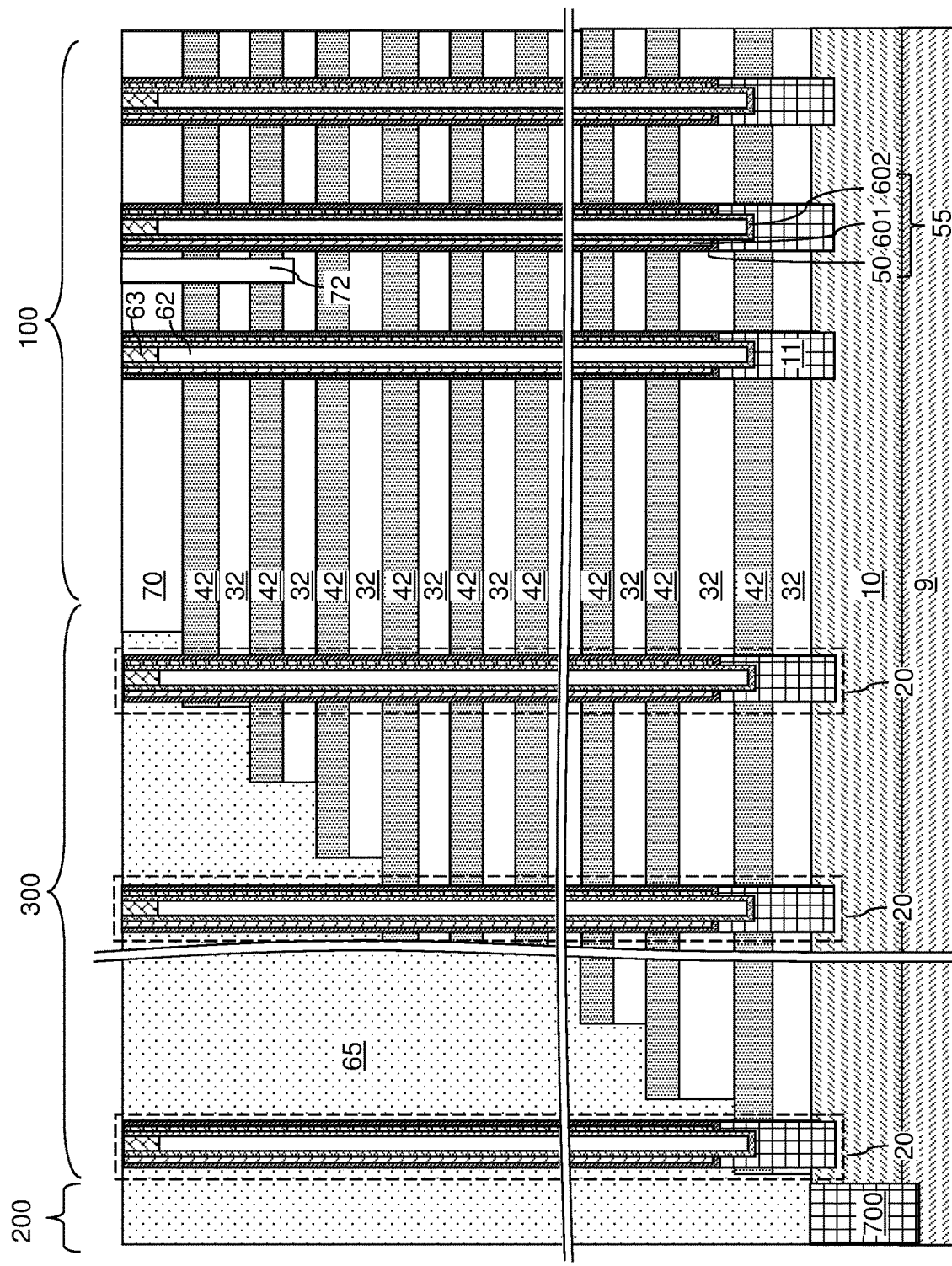
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions (e.g., comprising portions of the charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
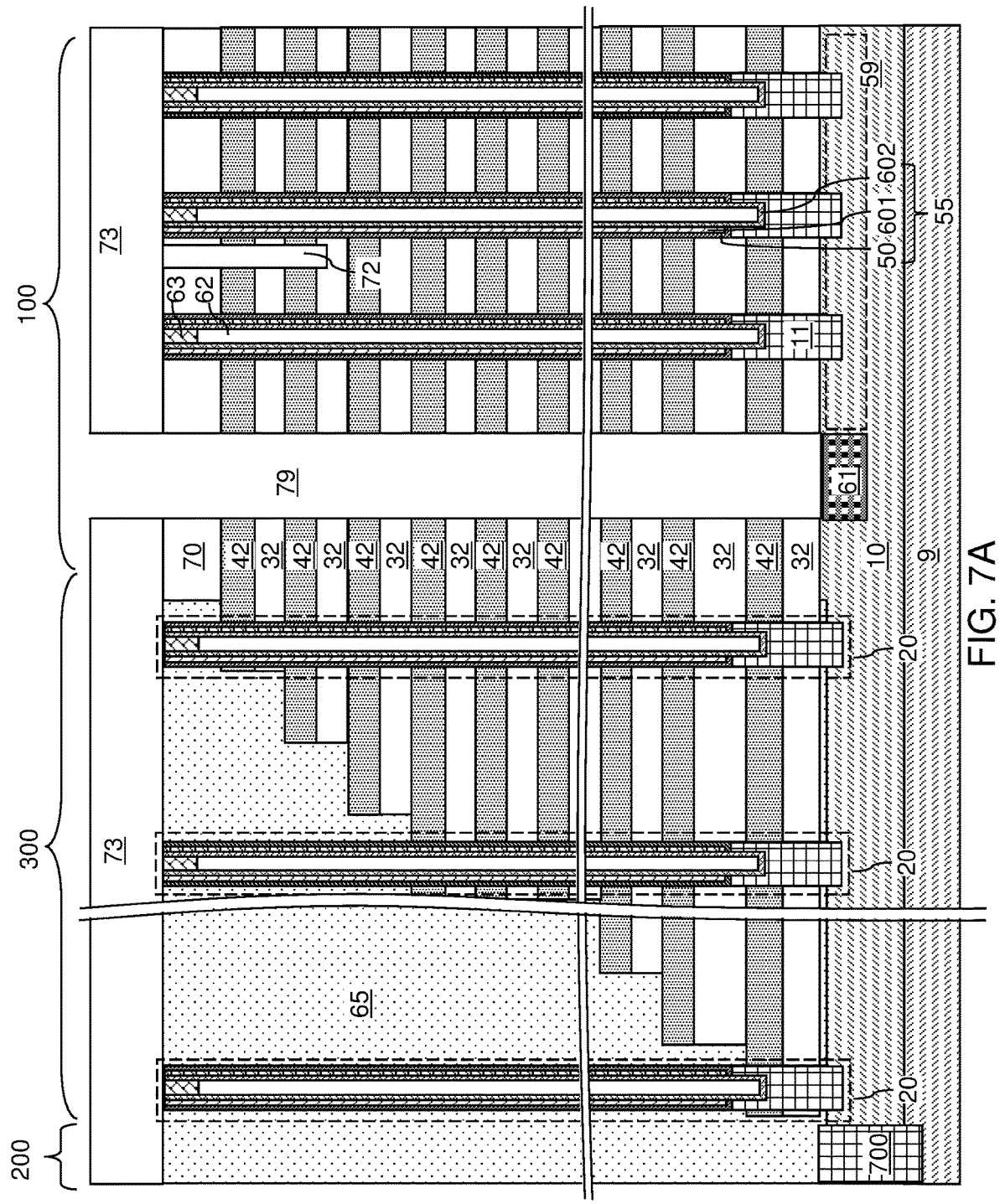
FIG. 7A is a schematic vertical cross-sectional view of the exemplary structure after formation of backside trenches according to an embodiment of the present disclosure.
Figure 7B:
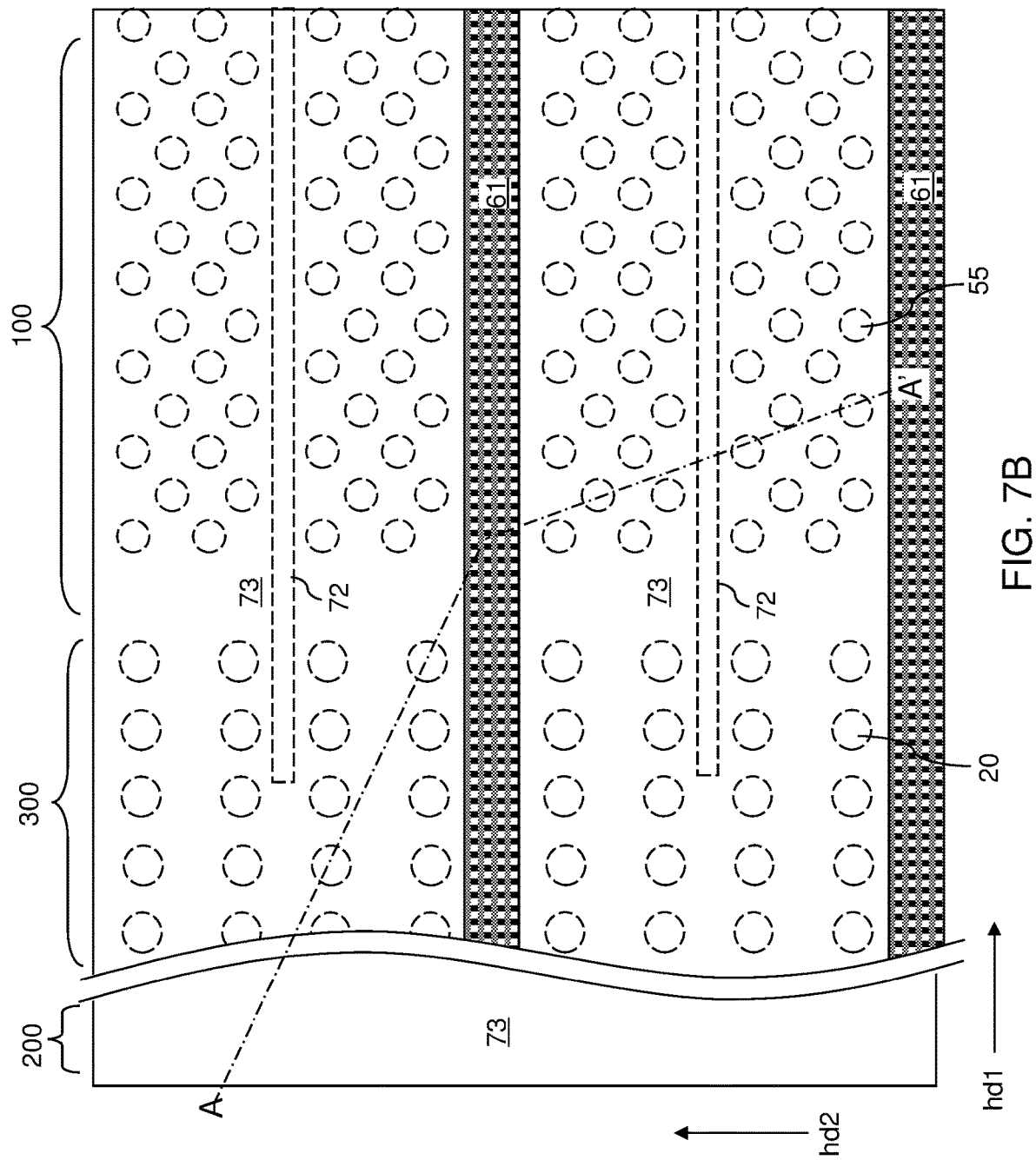
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
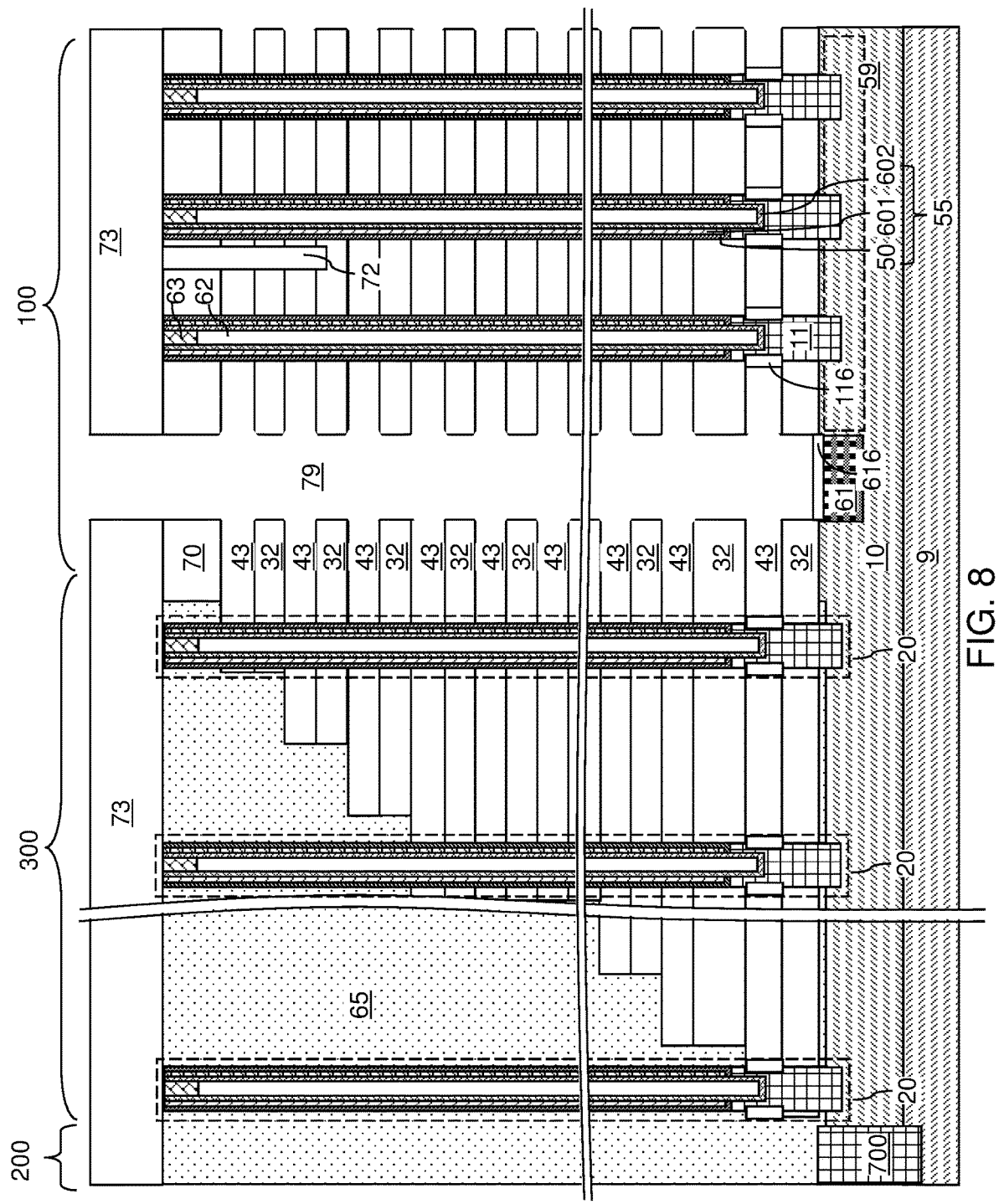
FIG. 8 is a schematic vertical cross-sectional view of the exemplary structure after formation of backside recesses according to an embodiment of the present disclosure.

Referring to FIGS. 8 and 9A, a first configuration of the exemplary structure is illustrated after next processing steps. Specifically, an isotropic etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9D:
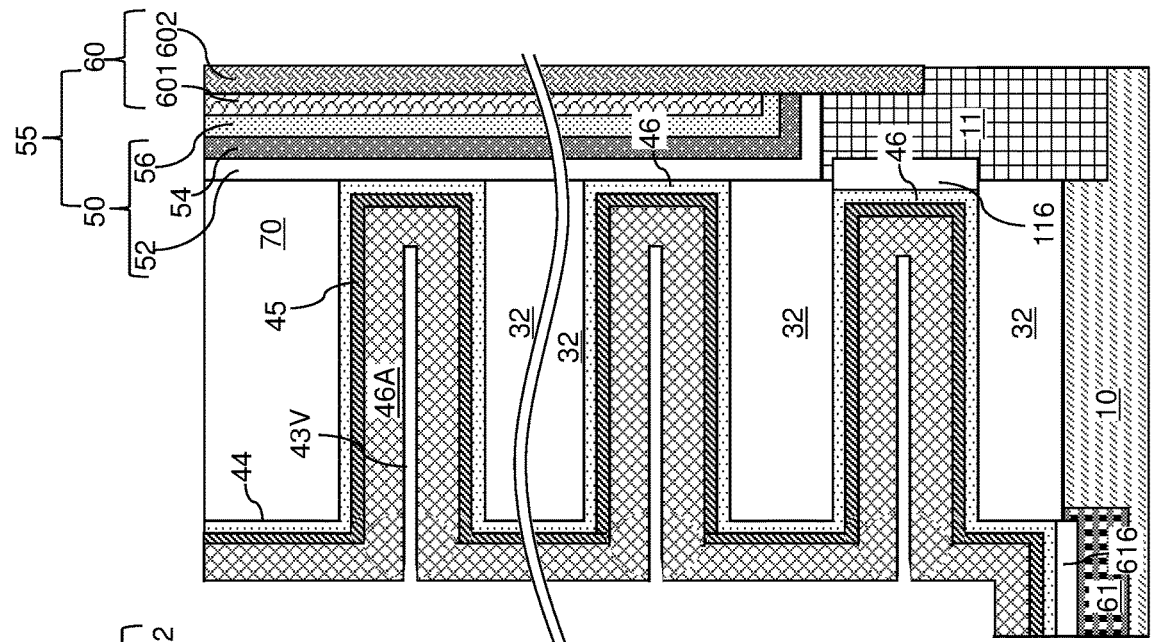
Figure 9C:
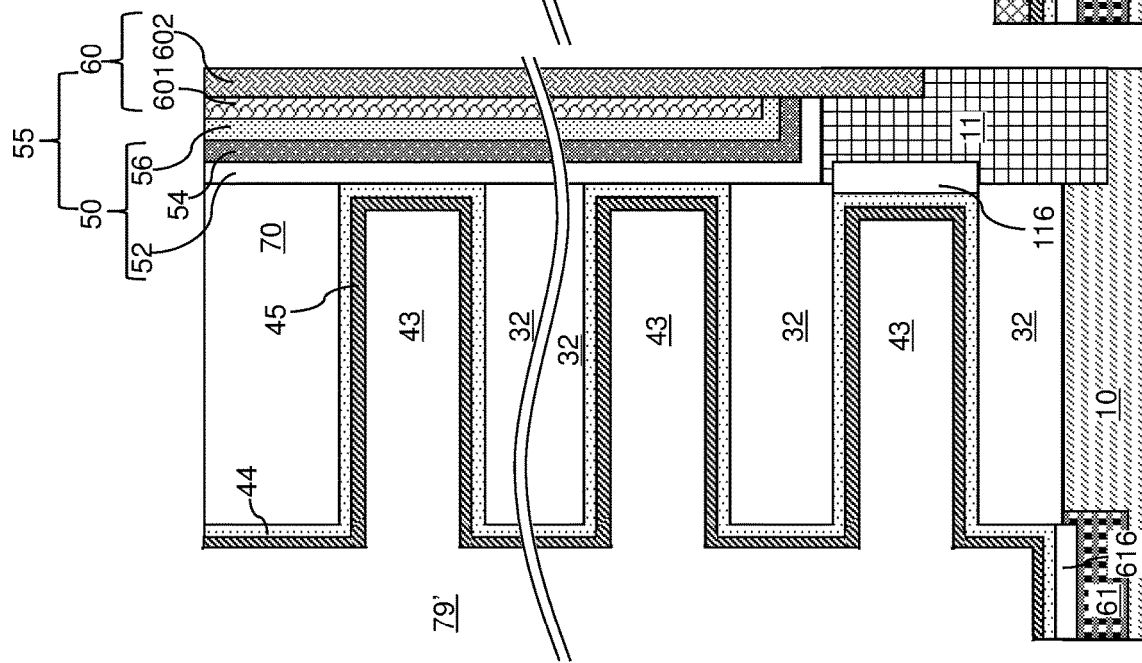

Referring to FIG. 9C, a metallic barrier liner 45 can be deposited in the backside recesses 43. The metallic barrier liner 45 includes an electrically conductive metallic material that can function as a diffusion barrier layer and/or adhesion promotion layer for a metallic fill material to be subsequently deposited. The metallic barrier liner 45 can include a conductive metallic nitride material such as TiN, TaN, WN, or a stack thereof, or can include a conductive metallic carbide material such as TiC, TaC, WC, or a stack thereof. In one embodiment, the metallic barrier liner 45 can be deposited by a conformal deposition process such as chemical vapor deposition (CVD) or atomic layer deposition (ALD). The thickness of the metallic barrier liner 45 can be in a range from 2 nm to 8 nm, such as from 3 nm to 6 nm, although lesser and greater thicknesses can also be employed. In one embodiment, the metallic barrier liner 45 can consist essentially of a conductive metal nitride such as TiN.

Referring to FIG. 9D, a first metal fill material is deposited in the plurality of backside recesses 43, on the sidewalls of the at least one the backside trench 79, and over the top surface of the contact level dielectric layer 73 to form a first metal layer 46A. The first metallic fill material can be deposited by a conformal deposition method, which can be, for example, chemical vapor deposition (CVD), atomic layer deposition (ALD), electroless plating, electroplating, or a combination thereof. In one embodiment, the first metal layer 46A can consist essentially of at least one elemental metal. In one embodiment, the first metal layer 46A can include an elemental metal that can be deposited by decomposition of a fluorine-containing precursor gas. In one embodiment, the first metal layer 46A can be deposited employing a fluorine-containing precursor gas such as $WF_6$. In one embodiment, the first metal layer 46A can be a tungsten layer including a residual level of fluorine atoms as impurities. The first metal layer 46A is spaced from the insulating layers 32 and the memory stack structures 55 by the metallic barrier liner 45, which is a metallic barrier liner that blocks diffusion of fluorine atoms therethrough.

Generally, the first metal layer 46A containing an elemental metal can be deposited in the backside recesses 43 by decomposition of a precursor gas containing a compound of the elemental metal and at least one fluorine atom. The thickness of the first metal layer 46A can be selected such that an unfilled volume (i.e., void or seam) 43V of a backside recess 43 has a height in a range from a monolayer of silicon to less than 10 nm (such as less than 5 nm, and/or less than 4 nm, and/or less than 3 nm), such as 1 to 3 nm.

Referring to FIG. 9E, a first precursor gas adsorption layer 33A can be formed on the physically exposed surface of the first metal layer 46A in the void 43V. The first precursor gas adsorption layer 33A includes an adsorbed monolayer of molecules of a precursor gas that includes silicon. For example, the first precursor gas adsorption layer 33A may comprise a continuous or discontinuous chlorine layer (i.e., a chlorine surface passivation on the physically exposed surface of the first metal layer 46A). The first precursor gas adsorption layer 33A can be formed by exposing the first metal layer 46A to an ambient including a silicon-containing precursor gas, such as a silicon and chlorine containing precursor gas, at a temperature that is lower than a minimum temperature that is necessary to deposit silicon on the first metal layer 46A. The silicon-containing precursor gas may have a formula $SiH_xCl_y$, where x+y=4, or a formula $Si_2H_xCl_y$, where x+y=6. In an illustrative example, the silicon-containing precursor gas may be dichlorosilane, and the process temperature that forms the first precursor gas adsorption layer 33A may be in a range from 300 degrees Celsius to 500 degrees Celsius. The first precursor gas adsorption layer 33A may fill the entire remaining volume of a backside recess, or may only partially fill a volume of a backside recess depending on the height of an unfilled cavity within the backside recess. The first precursor gas adsorption layer 33A interacts with residual fluorine atoms within the first metal layer 46A, and forms a volatile silicon fluoride compound such as $SiH_3F$, $SiH_2F_2$, or $SiHF_3$. In other words, the silicon-containing precursor gas scavenges fluorine atoms from the fluorine containing first metal layer 46A. For example dichlorosilane (i.e., $SiH_2Cl_2$) may scavenge fluorine atoms from a fluorine-containing tungsten layer 46 to form difluorosilane (i.e., $SiH_2F_2$), which is a volatile fluoride compound gas. Molecules of the volatile silicon fluoride compound evaporate, and other molecules (e.g., chlorine molecules) of the silicon-containing precursor gas can fill the volume (e.g., the seams in the tungsten layer 46A) from which the volatile silicon fluoride compound evaporates. Generally, adsorption of the molecules (e.g., chlorine molecules) of the precursor gas on the surface of the first metal layer 46A can be performed at a temperature that does not induce deposition of silicon on the surface of the first metal layer 46A. In general, the thickness of the first precursor gas adsorption layer 33A does not exceed 1 monolayer. The first precursor gas adsorption layer 33A may comprise a chlorine passivation layer or a mixed chlorine and fluorine passivation layer if some fluorine remains adsorbed to the tungsten layer in the seams.

The silicon-containing precursor gas functions as a gettering gas that chemically removes residual fluorine atoms from the first metal layer 46A. Generally, residual fluorine atoms in the first metal layer 46A adversely affect performance of a three-dimensional memory device by diffusing into the insulating layers 32 and the memory stack structures 55 and causing pitting and voids therein (e.g., in the insulating layers 32 and in the blocking dielectric 52) during fluorine degassing. Removal of the residual fluorine atoms from the first metal layer 46A provides the benefit of enhancing the reliability of the three-dimensional memory device.

Referring to FIG. 9F, the exemplary structure can be annealed to a temperature at which the silicon-containing precursor gas decomposes to deposit a first silicon layer 34A in the void 43V. The chlorine in the first precursor gas adsorption layer 33A may be desorbed during the annealing and evaporates as a chlorine or a chlorine-containing gas. The first silicon layer 34A can be formed on the surfaces of the first metal layer 46A, and may have a thickness of one monolayer of silicon to 10 nm, such as 1 nm to 5 nm, for example 2 nm to 4 nm. For example, if the silicon-containing precursor gas is dichlorosilane, then the anneal temperature may be in a range from 550 degrees to 700 degrees. Optionally, an additional silicon-containing precursor gas can be flowed into a process chamber in which the exemplary structure is placed, and can be decomposed to provide additional silicon material that is incorporated into the first silicon layer 34A. In the embodiment of FIG. 9F, the first silicon layer 34A may completely fill remaining volumes of the backside recesses 43.

Referring to FIG. 9G, the first silicon layer 34A and the first metal layer 46A can be annealed at an elevated temperature that can induce silicidation of the first metal layer 46A. A silicidation reaction between the silicon layer 34A and a surface portion of the first metal layer 46A occurs to form a first metal silicide layer 48A. For example, if the first metal layer 46A consists essentially of tungsten, an anneal temperature of 750 to 950 degrees Celsius, such as 800 to 850 degrees Celsius can be used to induce formation of the first metal silicide layer 48A. The first metal silicide layer 48A comprises a metal silicide of the elemental metal of the first metal layer 46A. For example, the first metal silicide layer 48A may comprise a tungsten silicide layer. The thickness of the first metal silicide layer 48A depends on the thickness of the first silicon layer 34A, and may be in a range from 0.3 nm to 10 nm, such as from 1 nm to 4 nm, although lesser and greater thicknesses may also be employed.

Referring to FIG. 9H, the deposited metallic materials of the metallic barrier liner 45, the first metal layer 46A, and the first metal silicide layer 48A can be etched back from inside each backside trench 79 and from above the contact level dielectric layer 73, for example, by an isotropic wet etch, an anisotropic dry etch, or a combination thereof. Thus, portions of the first metal layer 46A and the first metal silicide layer 48A that are deposited in the backside trenches 79 can be removed. Each remaining contiguous set of the deposited metallic materials in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, each first metal silicide layer 48A can be spaced from a respective overlying one of the insulating layers 32, from a respective one of the underlying one of the insulating layers 32, and from a respective set of the memory openings (and thus, from a respective set of the memory stack structures 55) by a same spacing, which can be the same as the sum of the thickness of the backside blocking dielectric layer 44, the thickness of the metallic barrier liner 45, and the first metal layer 46A. The electrically conductive layers 46 comprise a subset in which each electrically conductive layer 46 includes a metallic barrier liner 45, a first metal layer 46A, and a first metal silicide layer 48A. In one embodiment, each electrically conductive layer 46 within the subset of the electrically conductive layers 46 can be spaced from an overlying one of the insulating layers 32, an underlying one of the insulating layers 32, and from a set of memory stack structures 55 by a backside blocking dielectric layer 44. In one embodiment, each electrically conductive layer 46 within the subset of the electrically conductive layers 46 comprises a respective metallic barrier liner 45 comprising a conductive compound of at least one metal and at least one non-metallic element. In one embodiment, each metallic barrier liner 45 comprises one of TiN, TaN, or WN, and the first metal layers 46A comprise tungsten.

In one embodiment, each first metal layer 46A within the subset of the electrically conductive layers 46 comprises an upper horizontally-extending metal sheet including first openings around each of the memory openings 49 between a pair of backside trenches 79, a lower horizontally-extending metal sheet including second openings around each of the memory openings between the pair of backside trenches 79, and vertically-extending cylindrical metal portions laterally surrounding a respective one of the memory openings 49 containing a respective memory stack structure 55 and vertically connecting the upper horizontally-extending metal sheet and the lower horizontally-extending metal sheet.

Referring to FIG. 10A, a second configuration of the exemplary structure is illustrated at a processing step of an alternative processing sequence that may be employed in lieu of the processing steps of FIGS. 9D-9H. In this case, the processing steps of FIG. 9D can be performed with a modification in the thickness of the first metal layer 46A such that a void (e.g., seam) of a sufficiently large size is present within each backside recess 43 for subsequently forming a metal silicide layer and another metal layer. For example, each backside recess 43 can include a void having a height in a range from 2 nm to 20 nm after formation of the first metal layer 46A.

Referring to FIG. 10B, the processing steps of FIG. 9E can be performed to form a first precursor gas adsorption layer 33A in the void 43V.

Figure 10C:
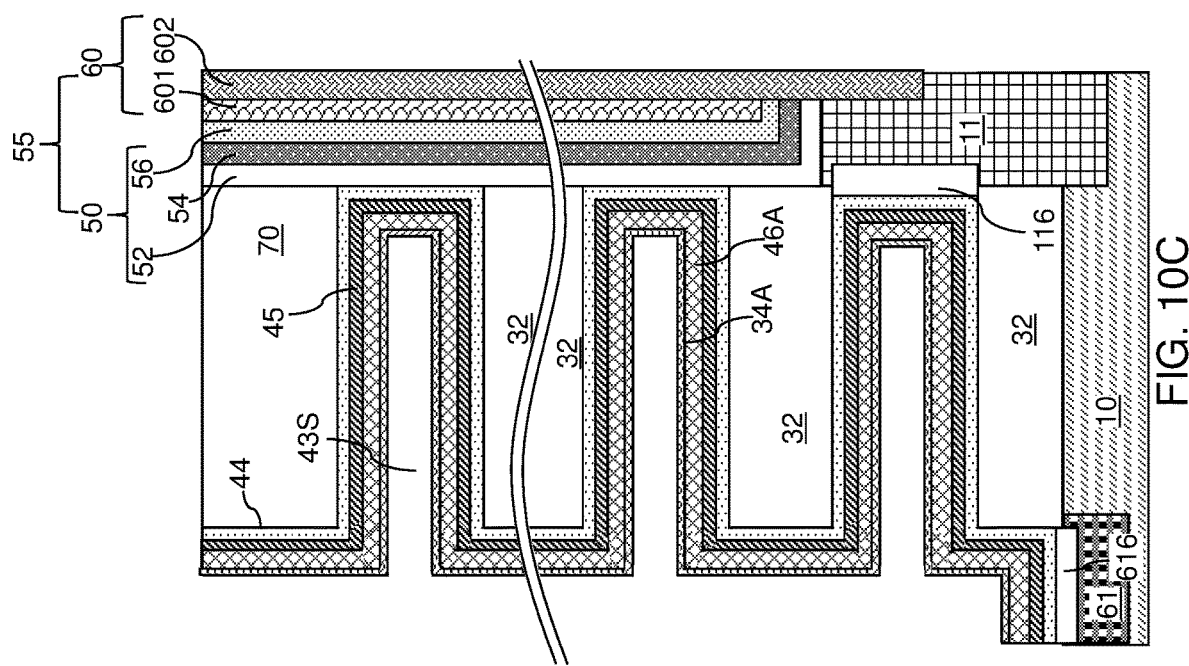

Referring to FIG. 10C, the processing steps of FIG. 9F can be performed to form a first silicon layer 34A. In this embodiment, the thickness of the first silicon layer 34A can be selected such that a seam 43S (which has a smaller height than the void 43V) is present within each backside recess 43 after formation of the first silicon layer 34A. For example, each seam 43S can have a height in a range from 1 nm to 15 nm after formation of the first silicon layer 34A.

Referring to FIG. 10D, a second metal fill material is deposited on the first silicon layer 34A to form a second metal layer 46B. The second metal fill material can be deposited by a conformal deposition method, which can be, for example, chemical vapor deposition (CVD), atomic layer deposition (ALD), electroless plating, electroplating, or a combination thereof. In one embodiment, the second metal layer 46B can consist essentially of at least one elemental metal. The second metal layer 46B may have the same material composition as, or may have a different material composition from, the first metal layer 46A. In one embodiment, the second metal layer 46B can include an elemental metal that can be deposited by decomposition of a fluorine-containing precursor gas. In one embodiment, the second metal layer 46B can be deposited employing a fluorine-containing precursor gas such as $WF_6$. In one embodiment, the second metal layer 46B can be a tungsten layer including a residual level of fluorine atoms as impurities.

Generally, the second metal layer 46B containing an elemental metal can be deposited in the seams 43S in the backside recesses 43 by decomposition of a precursor gas containing a compound of the elemental metal and at least one fluorine atom. The thickness of the second metal layer 46B can be selected such that an unfilled volume of a backside recess 43 has a height in a range from a monolayer of silicon to less than 10 nm (such as less than 5 nm, and/or less than 3 nm, and/or less than 2 nm), such as 0.5 nm to 2 nm. A narrow slit 43T remains in the backside recesses 43.

Referring to FIG. 10E, a second precursor gas adsorption layer 33B can be formed in the slits 43T. The second precursor gas adsorption layer 33B can have the same material composition as the first precursor gas adsorption layer 33A, and may be formed by performed the processing steps of FIG. 9E. The second precursor gas may also comprise a silicon and chlorine containing gas which scavenges the flouring from the second metal layer 46B.

Figure 10G:
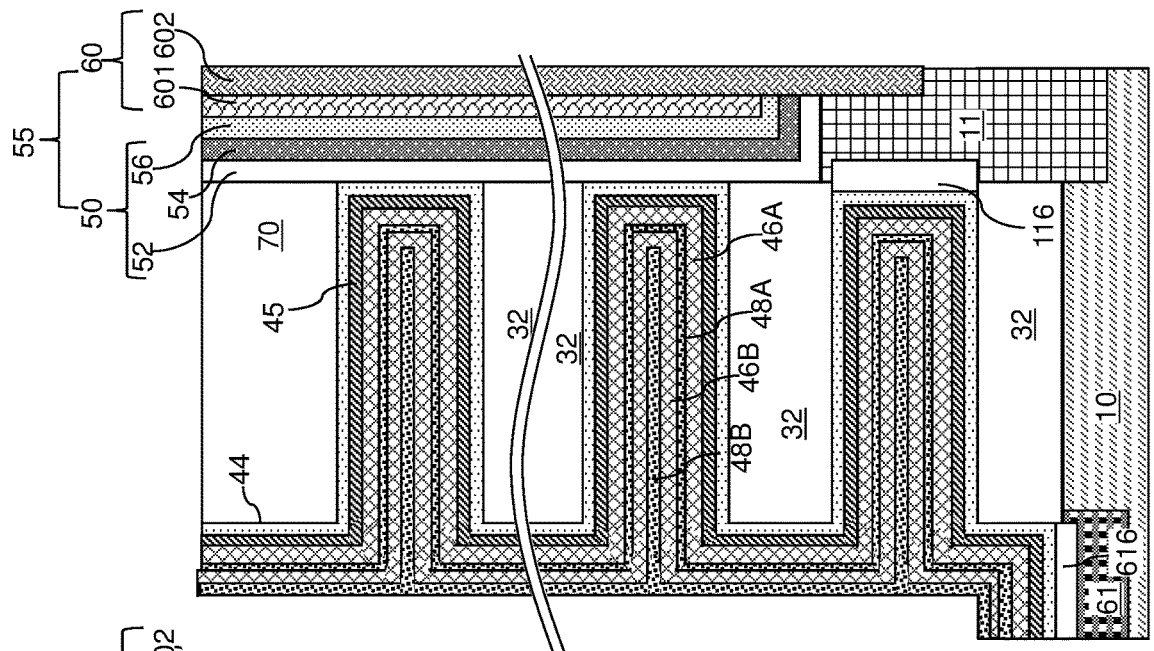
Figure 10F:
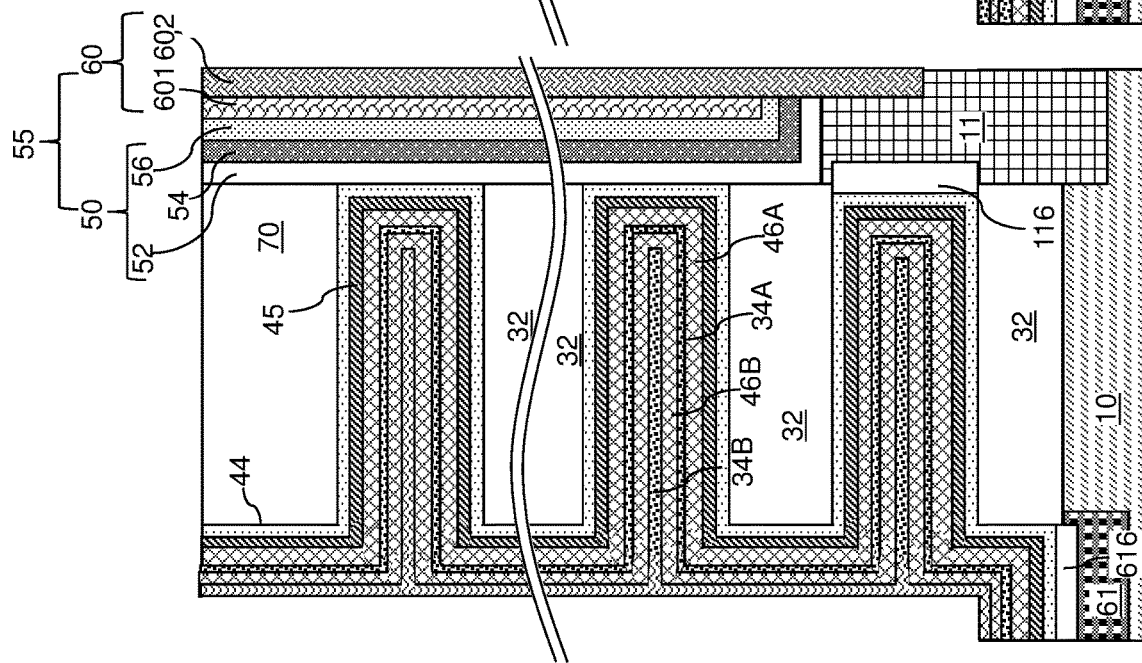

Referring to FIG. 10F, a second silicon layer 34B can be formed in the slits 43T. The second silicon layer 34B can have the same material composition and a same thickness range as the first silicon layer 34A, and may be formed by performing the processing steps of FIG. 9F. The second silicon layer 34B may have a thickness greater than 1 monolayer of silicon, such as 0.5 nm to 2 nm, and may completely fill remaining volumes of the backside recesses 43.

Referring to FIG. 10G, the second silicon layer 34B and the second metal layer 46B can be annealed at an elevated temperature that can induce silicidation of the first metal layers 46A and the second metal layer 46B. First and second metal silicide layers (48A, 48B) can be formed by reaction of the respective first and second silicon layers (34A and 34B) and surface portions of the first and second metal layers (46A, 46B).

Figure 10H:
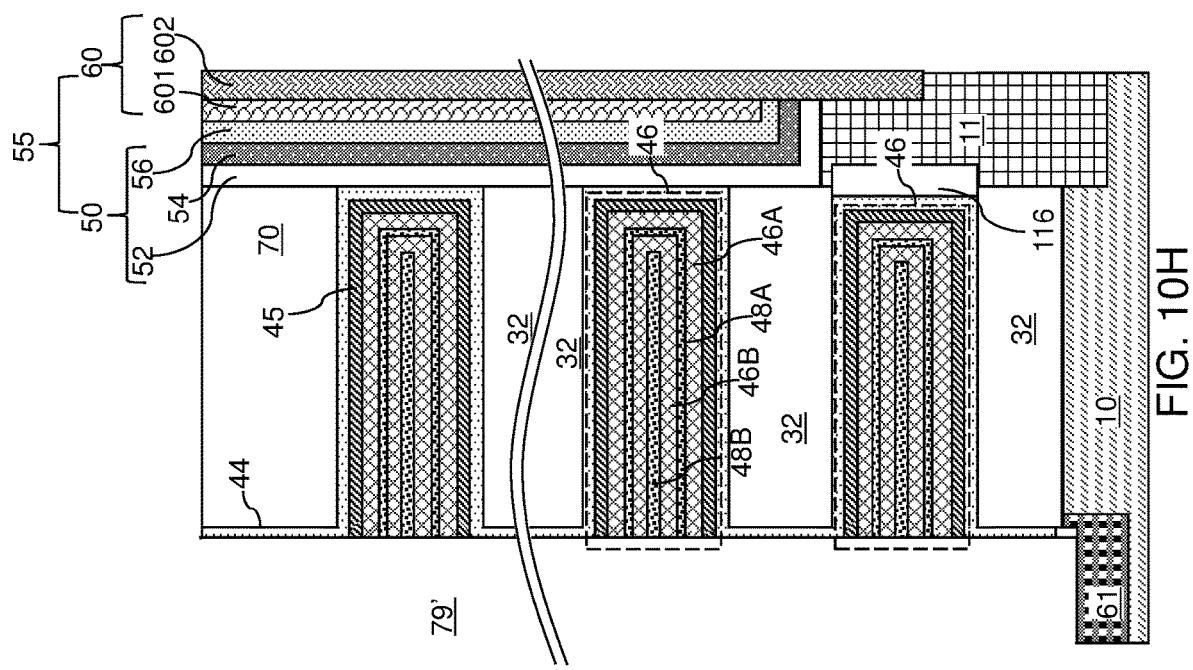

Referring to FIG. 10H, the deposited metallic materials of the metallic barrier liner 45, the first metal layer 46A, the first metal silicide layer 48A, the second metal layer 46B, and the second metal silicide layer 48B can be etched back from inside each backside trench 79 and from above the contact level dielectric layer 73, for example, by an isotropic wet etch, an anisotropic dry etch, or a combination thereof. Thus, portions of the first metal layer 46A, the first metal silicide layer 48A, the second metal layer 46B, and the second metal silicide layer 48B that are deposited in the backside trenches 79 can be removed. Each remaining contiguous set of the deposited metallic materials in the backside recesses 43 constitutes an electrically conductive layer 46. Each electrically conductive layer 46 can be a conductive line structure. Thus, the sacrificial material layers 42 are replaced with the electrically conductive layers 46.

The electrically conductive layers 46 comprise a subset in which each electrically conductive layer 46 includes a metallic barrier liner 45, a first metal layer 46A, a first metal silicide layer 48A, a second metal layer 46B, and a second metal silicide layer 48B. In one embodiment, each electrically conductive layer 46 within the subset of the electrically conductive layers 46 comprises a respective second metal layer 46B in contact with the respective first metal silicide layer 48A and spaced from the respective first metal silicide layer 46A by the respective first metal silicide layer 48A. In one embodiment, each first metal silicide layer 48A is spaced from a respective overlying one of the insulating layers 32, from a respective one of the underlying one of the insulating layers 32, and from a respective one of the memory stack structures 55 in the respective memory openings 49 by a same spacing.

In one embodiment, each first metal silicide layer 48A within the subset of the electrically conductive layers 46 comprises: an upper horizontally-extending metal sheet including first openings around each of the memory openings 49, a lower horizontally-extending metal sheet including second openings around each of the memory openings 49, and vertically-extending cylindrical metal portions laterally surrounding a respective one of the memory openings 49 and vertically connecting the upper horizontally-extending metal sheet and the lower horizontally-extending metal sheet.

In one embodiment, each electrically conductive layer 46 within the subset of the electrically conductive layers 46 comprises a respective second metal silicide layer 48B in contact with the respective second metal layer 46B and spaced from the respective first metal silicide layer 48A by the respective second metal layer 46B. In one embodiment, each first metal silicide layer 48A is spaced from a respective overlying one of the insulating layers 32, from a respective one of the underlying one of the insulating layers 32, and from a respective one of the memory stack structures 55 in the respective memory opening 49 by a same spacing, which can be the same as the sum of the thickness of the backside blocking dielectric layer 44, the thickness of the metallic barrier layer, and the thickness of the first metal layer 46A.

Figure 11A:
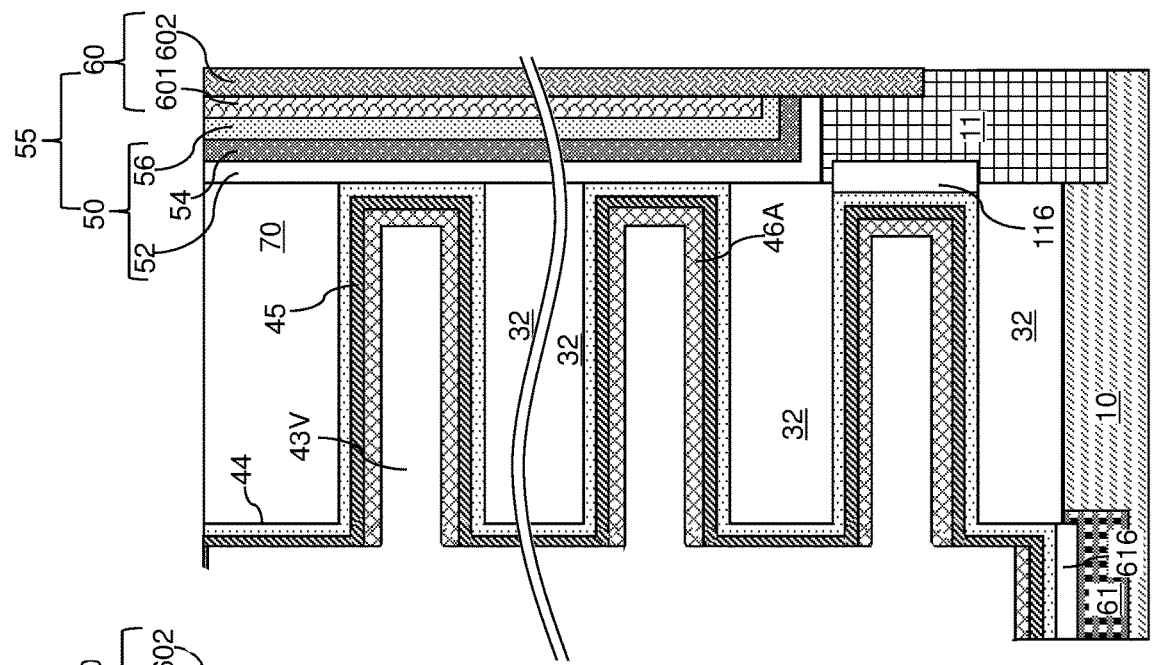

Referring to FIG. 11A, a third configuration of the exemplary structure is illustrated at a processing step of an alternative processing sequence that may be employed in lieu of the processing steps of FIGS. 9D-9H. In this case, the processing steps of FIG. 9D can be performed with a modification in the thickness of the first metal layer 46A such that a void 43V is present within each backside recess 43. For example, each backside recess 43 can include a void 43V having a height in a range from 0.5 nm to 10 nm after formation of the first metal layer 46A.

Figure 11B:
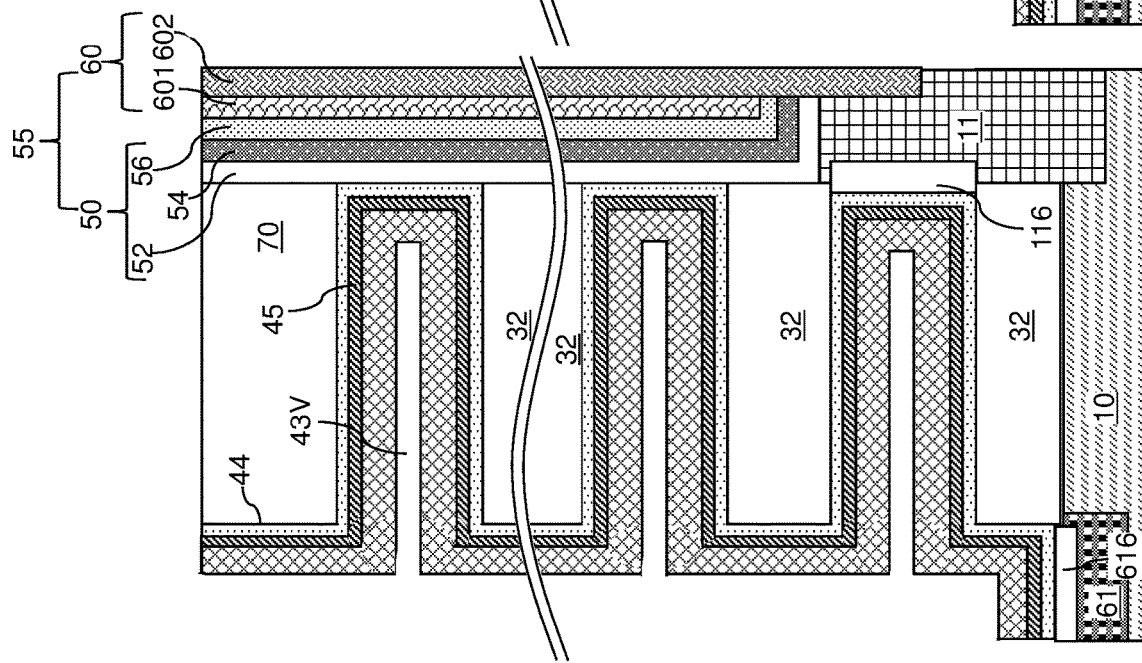

Referring to FIG. 11B, an isotropic recess etch process can be performed to isotropically recess the first metal layer 46A. Each void 43V within the backside recesses 43 can be expanded by the isotropic recess etch process. In one embodiment, each backside recess 43 can include a void 43V having a height in a range from 2 nm to 20 nm after formation of the first metal layer 46A. Portions of the first metal layer 46A located in the backside trenches 79 may be removed completely during the recess etch step.

Referring to FIG. 11C, the processing steps of FIG. 9E can be performed to form a first precursor gas adsorption layer 33A. A void 43V is present within each backside recess 43.

Referring to FIG. 11D, the processing steps of FIG. 9F can be performed to form a first silicon layer 34A in the void 43V. In one embodiment, the thickness of the first silicon layer 34A can be selected such that a seam 43S is present within each backside recess 43 after formation of the first silicon layer 34A. For example, each seam 43S can have a height in a range from 0.5 nm to 10 nm after formation of the first silicon layer 34A.

Referring to FIG. 10E, a second metal fill material is deposited on the first silicon layer 34A to form a second metal layer 46B. The second metallic fill material can be deposited by a selective deposition method, which can be, for example, chemical vapor deposition (CVD), atomic layer deposition (ALD), electroless plating, electroplating, or a combination thereof. In one embodiment, the second metal layer 46B can consist essentially of at least one elemental metal. The second metal layer 46B may have the same material composition as, or may have a different material composition from, the first metal layer 46A. In one embodiment, the second metal layer 46B can include a tungsten that can be deposited by decomposition of a chlorine-containing precursor gas. For example, the tungsten layer 46B can be selectively deposited in the seams 43S in the backside recesses 43 but not in the backside trenches 79 using tungsten hexachloride or pentachloride source gas, as described in U.S. Pat. No. 10,290,652 B2, incorporated herein by reference in its entirety. In one embodiment, the second metal layer 46B can be a tungsten layer including a residual level of chlorine atoms as impurities.

Generally, the second metal layer 46B containing an elemental metal can be selectively deposited in the backside recesses 43 by decomposition of a precursor gas containing a compound of the elemental metal and at least one chlorine atom. The thickness of the second metal layer 46B can be selected such that seam 43S in each backside recess 43 is completely filled by the second metal layer 46B.

Referring to FIG. 11F, the exemplary structure can be annealed at an elevated temperature that can induce silicidation of surface portions of the first metal layer 46A and the second metal layer 46B that contact the first silicon layer 34A. A first metal silicide layer 48A can be formed by reaction of surface portions of the first metal layer 46A and the second metal layer 46B with the first silicon layer 34A.

Figure 11G:
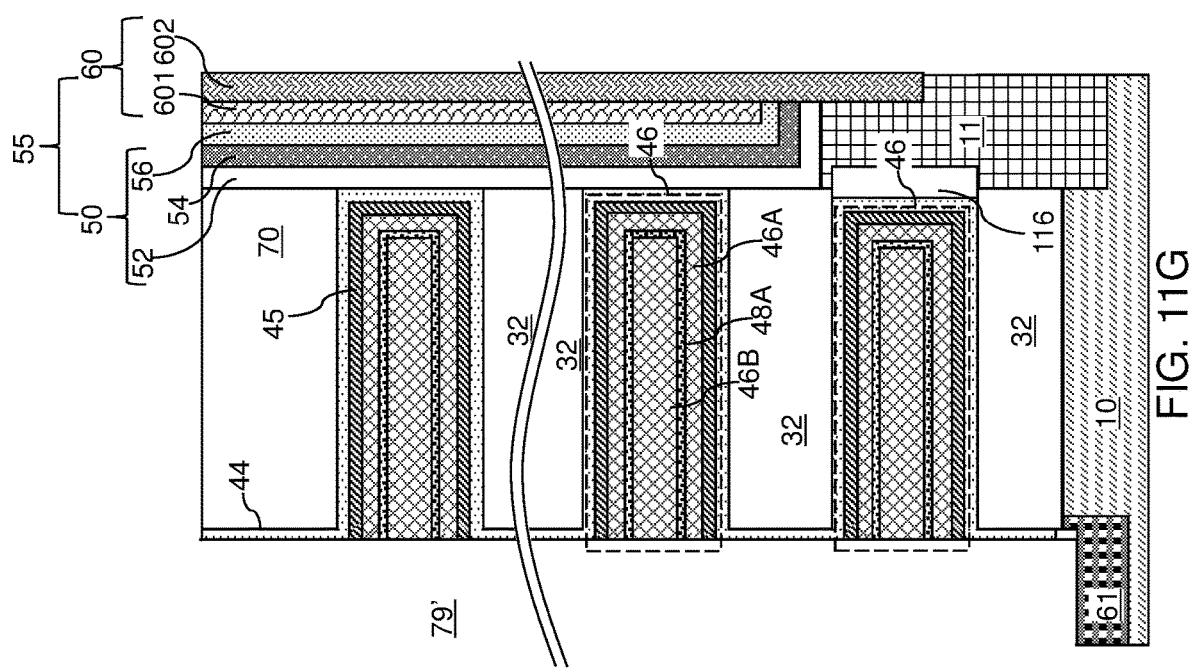

Referring to FIG. 11G, the metallic barrier liner 45 and other materials located in the backside trench 79 can be etched back from inside each backside trench 79, for example, by an isotropic wet etch, an anisotropic dry etch, or a combination thereof. Each remaining contiguous set of the deposited metallic materials in the backside recesses 43 constitutes an electrically conductive layer 46. Each electrically conductive layer 46 can be a conductive line structure. Thus, the sacrificial material layers 42 are replaced with the electrically conductive layers 46.

Thus, the method shown in the embodiment if FIGS. 11A to 11G includes recessing the first metal layer 46A prior to forming the first metal silicide layer 48A, depositing a silicon layer 34A on a surface of the first metal layer 46A after recessing the first metal layer, selectively depositing a second metal (e.g., tungsten) layer 46B on the silicon layer 34A, and annealing the silicon layer, the first metal layer and the second metal layer, wherein the first metal silicide layer 48A is formed by a silicidation reaction between the silicon layer and surface portions of the first and the second metal layers.

The electrically conductive layers 46 comprise a subset in which each electrically conductive layer 46 includes a metallic barrier liner 45, a first metal layer 46A, a first metal silicide layer 48A, and a second metal layer 46B. In one embodiment, each electrically conductive layer 46 within the subset of the electrically conductive layers 46 comprises a respective second metal layer 46B in contact with the respective first metal silicide layer 48A and spaced from the respective first metal layer 46A by the respective first metal silicide layer 48A. In one embodiment, each first metal silicide layer 48A is spaced from a respective overlying one of the insulating layers 32, from a respective one of the underlying one of the insulating layers 32, and from a respective one of memory stack structures 55 in the respective the memory opening 49 by a same spacing.

In one embodiment, each first metal silicide layer 48A within the subset of the electrically conductive layers 46 comprises: an upper horizontally-extending metal sheet including first openings around each of the memory openings 49, a lower horizontally-extending metal sheet including second openings around each of the memory openings 49, and vertically-extending cylindrical metal portions laterally surrounding a respective one of the memory openings 49 and vertically connecting the upper horizontally-extending metal sheet and the lower horizontally-extending metal sheet. In one embodiment, each first metal silicide layer 48A is spaced from a respective overlying one of the insulating layers 32, from a respective one of the underlying one of the insulating layers 32, and from a respective one of the memory openings 49 by a same spacing, which can be the same as the sum of the thickness of the backside blocking dielectric layer 44, the thickness of the metallic barrier layer, and the thickness of the first metal layer 46A.

Generally, each sacrificial material layer 42 can be replaced with an electrically conductive layer 46. At least one bottommost electrically conductive layer 46 laterally surrounds each tubular dielectric spacer 116 upon formation of the electrically conductive layers 46 and functions as a source side select gate electrode. At least one topmost electrically conductive layer 46 can function as a drain side select gate electrode.

Figure 12A:
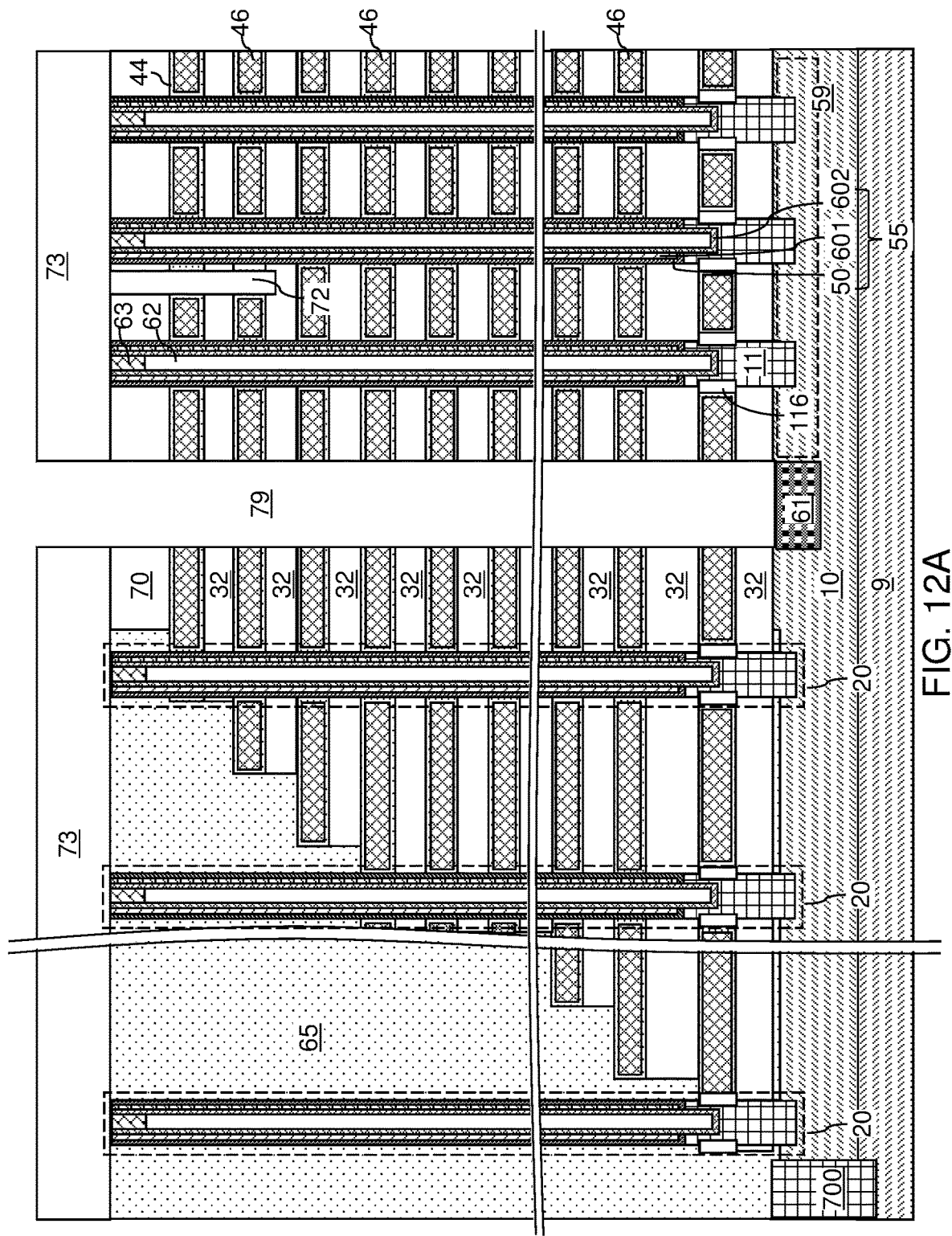
FIG. 12A is a schematic vertical cross-sectional view of the exemplary structure after removal of a deposited conductive material from within the backside trench according to an embodiment of the present disclosure.

Referring to FIGS. 12A and 12B, the exemplary structure is illustrated after formation of the electrically conductive layers 46. Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 13:
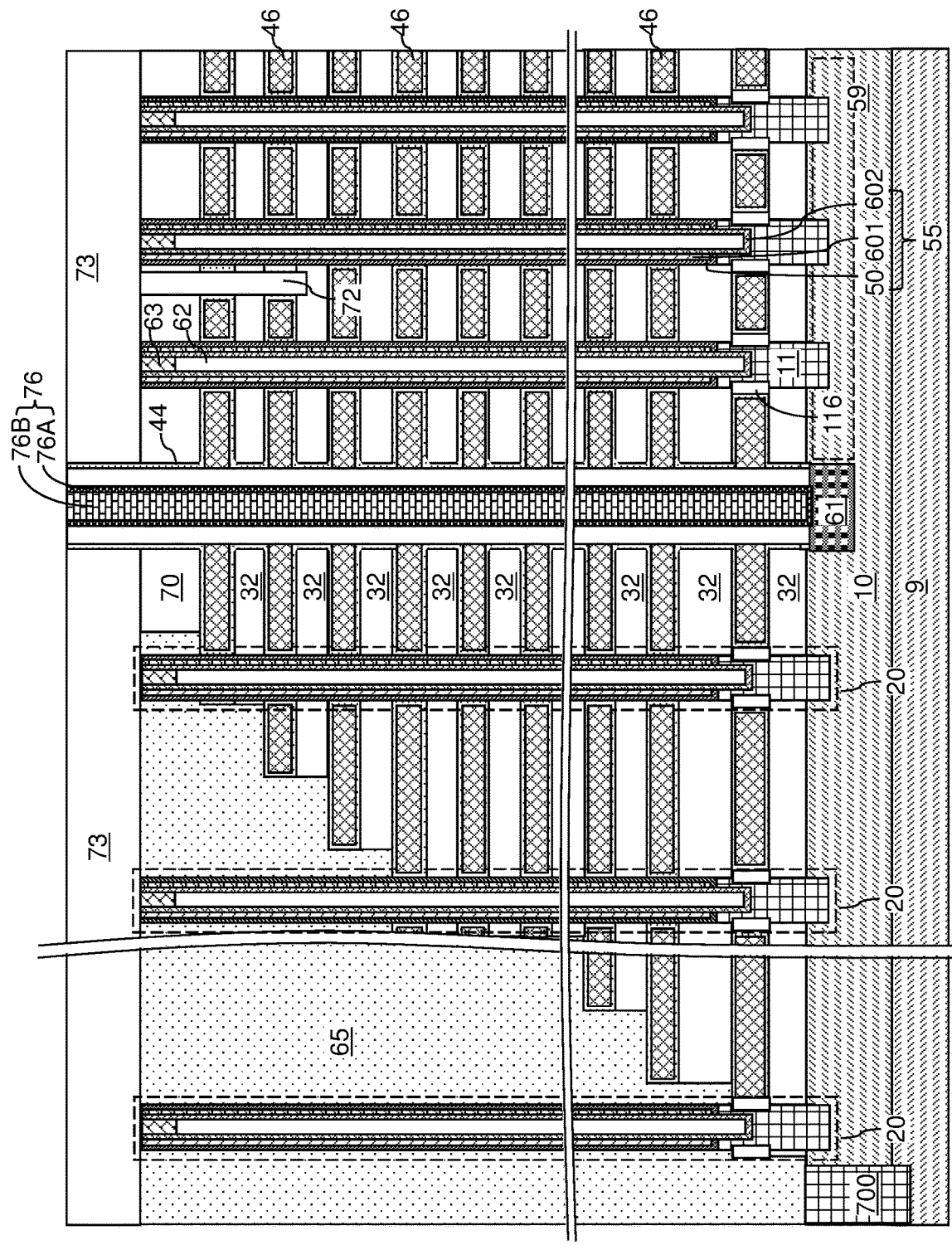
FIG. 13 is a schematic vertical cross-sectional view of the exemplary structure after formation of an insulating spacer and a backside contact structure according to an embodiment of the present disclosure.

Referring to FIG. 13, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 14B:
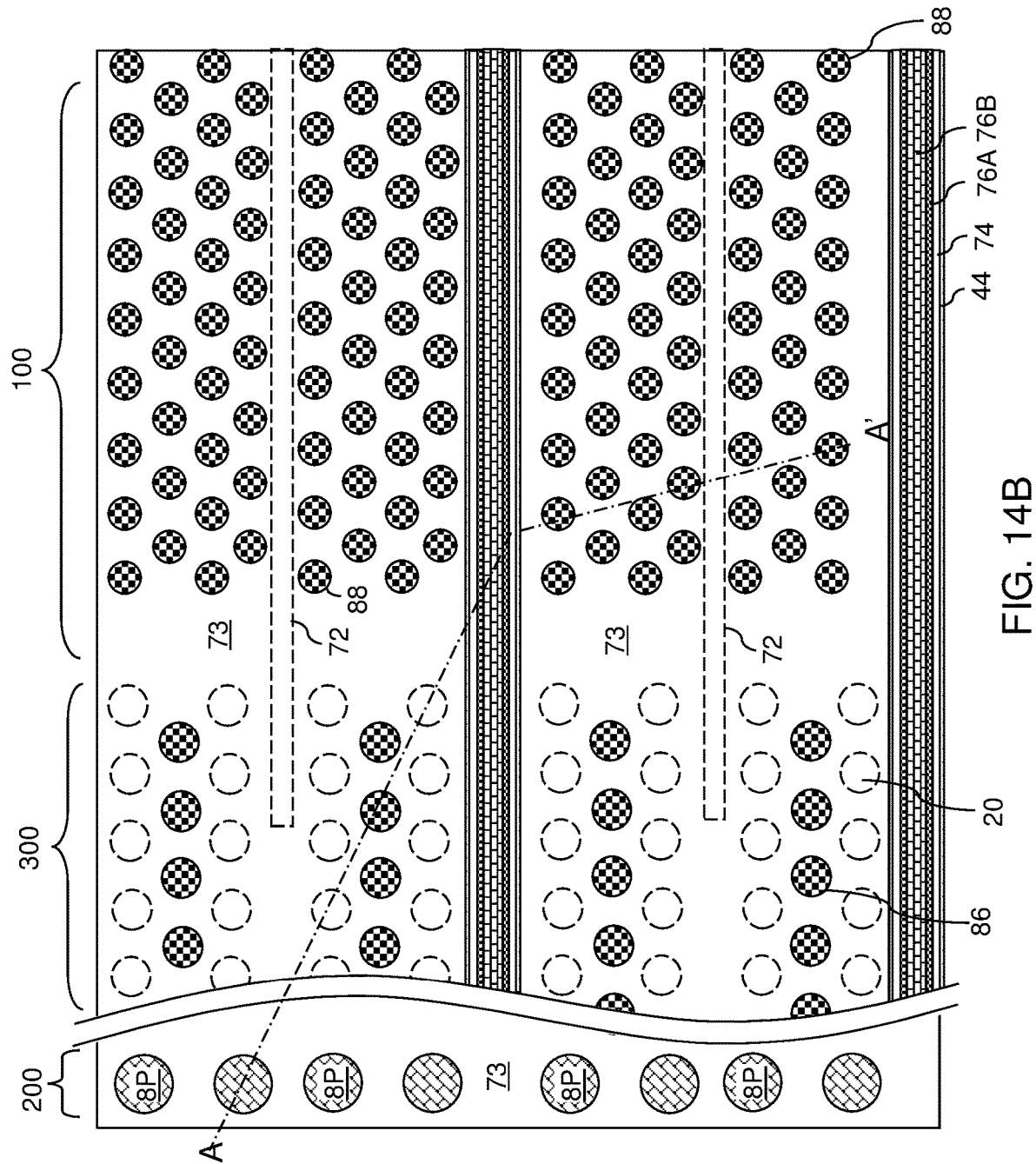
FIG. 14B is a top-down view of the exemplary structure of FIG. 14A. The vertical plane A-A' is the plane of the schematic vertical cross-sectional view of FIG. 14A.

Referring to FIGS. 14A and 14B, additional via openings can be formed through the contact level dielectric layer 73, and optionally through the retro-stepped dielectric material portion 65 and then filled with respective contact via structures (88, 86, 8P). The metal silicide layer(s) (48A, 48B) can be used as etch stop layers during the via opening etching. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers 32 and electrically conductive layers 46 located over a substrate (9, 10), wherein each electrically conductive layer 46 within a subset of the electrically conductive layers 46 comprises a respective first metal layer 46A containing an elemental metal and a respective first metal silicide layer 48A comprising a metal silicide of the elemental metal; memory openings 49 vertically extending through the alternating stack (32, 46); and memory opening fill structures 58 located within the memory openings 49 and comprising a respective memory film 50 and a respective vertical semiconductor channel 60. Each first metal silicide layer is spaced from a respective overlying one of the insulating layers, from a respective one of the underlying one of the insulating layers, and from a respective one of the memory openings by the respective first metal layer.

In the embodiment shown in FIG. 10H, each electrically conductive layer 46 within the subset of the electrically conductive layers further comprises a respective second metal silicide layer 48B in contact with a respective second metal layer 46B and spaced from the respective first metal silicide layer 48A by the respective second metal layer 46B.

In one embodiment, each first metal layer 46A within the subset of the electrically conductive layers 46 comprises an upper horizontally-extending metal sheet including first openings around each of the memory openings 49 between a pair of backside trenches 79, a lower horizontally-extending metal sheet including second openings around each of the memory openings between the pair of backside trenches 79, and vertically-extending cylindrical metal portions laterally surrounding a respective one of the memory openings 49 containing a respective memory stack structure 55 and vertically connecting the upper horizontally-extending metal sheet and the lower horizontally-extending metal sheet. The device further comprises a word line contact via structure 86 which extends through the upper horizontally-extending metal sheet and stops on the first metal silicide layer 48A. The structure 86 is formed by forming a via opening through an upper portion of the first metal layer (i.e., the upper horizontally-extending metal sheet) using the first metal silicide layer as an etch stop, and filling the via opening with the word line contact via structure 86 which contacts the first silicide layer 48A.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate can contain an integrated circuit comprising a driver circuit (containing at least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60).

The various embodiments of the present disclosure provide electrically conductive layers 46 from which residual fluorine atoms are scavenged during formation of at least one metal silicide layer (48A, 48B). This reduces subsequent fluorine outdiffusion and resulting pitting and voids in various insulating layers of the device. Further, the metal silicide layer(s) (48A, 48B) can be employed to eliminate and/or reduce the size of voids within the electrically conductive layers 46. Since the voids act as fluorine reservoirs, the reduction or elimination of the voids reduces fluorine related device reliability defects. Furthermore, vertical fluorine diffusion is reduced because the silicide serves as an effective fluorine blocking layer.

Due to differences in metal growth rates at outer and inner word line sections (typically outer word lines closer to the backside trenches 79 grow faster than inner word lines farther from the backside trenches), the outer word lines in prior art devices close (i.e., completely fill the backside recesses 43) first, leaving voids in the inner word lines. When the subsequent metal recess is performed using acid etching, the acid penetrates through these voids leading to device failures. By ensuring that the voids are completely filled with the silicide in the embodiments of the present disclosure, this problem can be reduced or prevented. Since silicide formation is accompanied by volume expansion, this provides a strong contact between the metal layers directly above and below the silicide layer once the silicide is formed. This reduces or eliminates boundary layers between metal layers through which acid can seep through.

Still further, the at least one silicide layer (48A, 48B) can be used as an etch stop during formation of via openings which are filled with the word line contact via structures 86. Thus, the contact via structures 86 do not penetrate through their respective electrically conductive layers 46 and thus reduce the chance of short circuits.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate, wherein each electrically conductive layer within a subset of the electrically conductive layers comprises a respective first metal layer containing an elemental metal and a respective first metal silicide layer comprising a metal silicide of the elemental metal;
   memory openings vertically extending through the alternating stack; and
   memory opening fill structures located within the memory openings and comprising a respective memory film and a respective vertical semiconductor channel,
   wherein each first metal silicide layer is spaced from a respective overlying one of the insulating layers, from a respective one of the underlying one of the insulating layers, and from a respective one of the memory openings by the respective first metal layer;
   wherein each electrically conductive layer within the subset of the electrically conductive layers further comprises a respective second metal layer in contact with the respective first metal silicide layer and spaced from the respective first metal layer by the respective first metal silicide layer; and
   wherein each electrically conductive layer within the subset of the electrically conductive layers comprises a respective second metal silicide layer in contact with the respective second metal layer and spaced from the respective first metal silicide layer by the respective second metal layer.

2. The three-dimensional memory device of claim 1, wherein each first metal silicide layer is spaced from a respective overlying one of the insulating layers, from a respective one of the underlying one of the insulating layers, and from a respective one of the memory openings by a same spacing.

3. A three-dimensional memory device comprising:
an alternating stack of insulating layers and electrically conductive layers located over a substrate, wherein each electrically conductive layer within a subset of the electrically conductive layers comprises a respective first metal layer containing an elemental metal and a respective first metal silicide layer comprising a metal silicide of the elemental metal;
memory openings vertically extending through the alternating stack; and
memory opening fill structures located within the memory openings and comprising a respective memory film and a respective vertical semiconductor channel,
wherein each first metal silicide layer is spaced from a respective overlying one of the insulating layers, from a respective one of the underlying one of the insulating layers, and from a respective one of the memory openings by the respective first metal layer;
wherein each first metal layer within the subset of the electrically conductive layers comprises:
an upper horizontally-extending metal sheet including first openings around each of the memory openings;
a lower horizontally-extending metal sheet including second openings around each of the memory openings; and
vertically-extending cylindrical metal portions laterally surrounding a respective one of the memory openings and vertically connecting the upper horizontally-extending metal sheet and the lower horizontally-extending metal sheet; and
further comprising a word line contact via structure which extends through the upper horizontally-extending metal sheet and stops on the first metal silicide layer.

4. A method of forming a three-dimensional memory device, comprising:
forming an alternating stack of insulating layers and sacrificial material layers over a substrate;
forming memory openings vertically extending through the alternating stack;
forming memory opening fill structures in the memory openings, wherein each of the memory opening fill structures comprises a respective memory film and a respective vertical semiconductor channel;
forming backside recesses by removing the sacrificial material layers selective to the insulating layers and the memory opening fill structures;
depositing a first metal layer containing an elemental metal in the backside recesses;
forming a first metal silicide layer comprising a metal silicide of the elemental metal on the first metal layer;
recessing the first metal layer prior to forming the first metal silicide layer;
depositing a silicon layer on a surface of the first metal layer after recessing the first metal layer;
selectively depositing a second metal layer on the silicon layer; and
annealing the silicon layer, the first metal layer and the second metal layer, wherein the first metal silicide layer is formed by a silicidation reaction between the silicon layer and surface portions of the first and the second metal layers and wherein the second metal layer is located on the first metal silicide layer.

* * * * *